(12) United States Patent
Jeon et al.

(10) Patent No.: US 12,295,194 B2
(45) Date of Patent: May 6, 2025

(54) DISPLAY DEVICE INCLUDING PROTECTIVE LAYER OVERLAPPING BACKPLANE LINE AND METHOD OF MANUFACTURING THE SAME

(71) Applicant: Samsung Display Co., LTD., Yongin-si (KR)

(72) Inventors: Hyung Il Jeon, Yongin-si (KR); Sung Kook Park, Yongin-si (KR); Ki Seong Seo, Yongin-si (KR); So Yeon Yoon, Yongin-si (KR); Joo Woan Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 623 days.

(21) Appl. No.: 17/561,074

(22) Filed: Dec. 23, 2021

(65) Prior Publication Data
US 2022/0352240 A1  Nov. 3, 2022

(30) Foreign Application Priority Data

Apr. 30, 2021  (KR) .................. 10-2021-0056897
Jun. 4, 2021  (KR) .................. 10-2021-0073065

(51) Int. Cl.
*H10H 29/14*  (2025.01)
*H10H 20/01*  (2025.01)
*H10H 20/831*  (2025.01)
*H10H 20/851*  (2025.01)
*H10H 20/856*  (2025.01)

(52) U.S. Cl.
CPC ........ *H10H 29/142* (2025.01); *H10H 20/831* (2025.01); *H10H 20/851* (2025.01); *H10H 20/856* (2025.01); *H10H 20/032* (2025.01); *H10H 20/0363* (2025.01)

(58) Field of Classification Search
CPC ....... H01L 27/156; H01L 33/38; H01L 33/50; H01L 33/60; H01L 2933/0016; H01L 2933/0058; H01L 25/167; H01L 33/44; H01L 33/504; H01L 33/62; H01L 25/0753
See application file for complete search history.

(56) References Cited

U.S. PATENT DOCUMENTS

| | | |
|---|---|---|
| 8,987,765 B2 | 3/2015 | Bibl et al. |
| 9,029,880 B2 | 5/2015 | Sakariya et al. |
| 9,240,397 B2 | 1/2016 | Bibl et al. |
| 10,684,698 B2 | 6/2020 | Baek et al. |
| 11,189,745 B2 | 11/2021 | Tsubuku et al. |

(Continued)

FOREIGN PATENT DOCUMENTS

| | | |
|---|---|---|
| CN | 111868940 | 10/2020 |
| JP | 2021-15177 | 2/2021 |

(Continued)

*Primary Examiner* — Kyoung Lee
*Assistant Examiner* — Sophia W Kao
(74) *Attorney, Agent, or Firm* — KILE PARK REED & HOUTTEMAN PLLC

(57) ABSTRACT

A display device includes a backplane line disposed on a substrate, a protective layer overlapping the backplane line, a first electrode disposed on the protective layer, a light emitting element electrically connected to the first electrode, and a reflective pattern including a reflective material and disposed between the substrate and the first electrode, the reflective pattern overlaps the backplane line in a plan view.

17 Claims, 17 Drawing Sheets

(56) References Cited

U.S. PATENT DOCUMENTS

| | | | |
|---|---|---|---|
| 11,424,312 B2 | 8/2022 | Baek et al. | |
| 11,855,053 B2 | 12/2023 | Kong et al. | |
| 11,916,178 B2 | 2/2024 | Kwag et al. | |
| 2015/0009460 A1 | 1/2015 | Jang et al. | |
| 2018/0197924 A1* | 7/2018 | Tada | H10K 50/844 |
| 2018/0341147 A1* | 11/2018 | Sugitani | G02F 1/133617 |
| 2020/0005703 A1* | 1/2020 | Kim | H10K 59/131 |
| 2020/0075667 A1* | 3/2020 | Lee | H01L 33/36 |
| 2022/0149024 A1* | 5/2022 | Jia | G09G 3/3233 |
| 2022/0199725 A1 | 6/2022 | Choi et al. | |

FOREIGN PATENT DOCUMENTS

| | | |
|---|---|---|
| KR | 10-2015-0005053 | 1/2015 |
| KR | 10-2019-0003905 | 1/2019 |
| KR | 10-2019-0067414 | 6/2019 |
| KR | 10-1973855 | 8/2019 |
| KR | 10-2039838 | 11/2019 |
| KR | 10-2020-0063386 | 6/2020 |
| KR | 10-2020-0073340 | 6/2020 |
| KR | 10-2021-0035358 | 4/2021 |
| KR | 10-2022-0087669 | 6/2022 |

\* cited by examiner

DISPLAY DEVICE INCLUDING PROTECTIVE LAYER OVERLAPPING BACKPLANE LINE AND METHOD OF MANUFACTURING THE SAME

CROSS-REFERENCE TO RELATED APPLICATION(S)

This application claims priority to and benefits of Korean Patent Application No. 10-2021-0056897 under 35 U.S.C. § 119 filed on Apr. 30, 2021 and Korean Patent Application No. 10-2021-0073065 under 35 U.S.C. § 119 filed on Jun. 4, 2021, in the Korean Intellectual Property Office, the entire contents of which are incorporated herein by reference.

BACKGROUND

1. Technical Field

The disclosure relates to a display device and a method of manufacturing the same.

2. Description of the Related Art

In recent years, as interest in information display is increasing, research and development for a display device are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure provides a display device and a method of manufacturing the same, in which damage to a line and an intermediate layer (via layer or the like) is prevented during a manufacturing process.

Another object of the disclosure provides a display device and a method of manufacturing the same, in which alignment of a light emitting element is improved.

Objects of the disclosure are not limited to the above-described objects, and other objects will be clearly understood by those skilled in the art from the following description.

According to an embodiment, a display device may include a backplane line disposed on a substrate; a protective layer overlapping the backplane line; a first electrode disposed on the protective layer; a light emitting element electrically connected to the first electrode; and a reflective pattern including a reflective material and disposed between the substrate and the first electrode, and the reflective pattern may overlap the backplane line in a plan view.

According to an embodiment, the reflective pattern may include a first disposition area and a second disposition area, and the reflective pattern may overlap the backplane line in the first disposition area and may not overlap the backplane line in the second disposition area.

According to an embodiment, the reflective pattern may include at least one of aluminum (Al), molybdenum (Mo), copper (Cu), silver (Ag), magnesium (Mg), platinum (Pt), palladium (Pd), gold (Au), nickel (Ni), neodymium (Nd), iridium (Ir), chromium (Cr), titanium (Ti), and an alloy thereof.

According to an embodiment, the reflective pattern may have a thickness of about 300 Å or more.

According to an embodiment, the reflective pattern may be disposed on the protective layer.

According to an embodiment, the display device may further include a bridge pattern disposed between the substrate and the first electrode and electrically connected to the first electrode through a contact portion, at least a portion of the reflective pattern may have a shape surrounding an area including the contact portion in a plan view.

According to an embodiment, the display device may further include a through hole by which at least a portion of the reflective pattern is spaced apart from another portion of the reflective pattern.

According to an embodiment, the protective layer may include an organic material, and the through hole may not overlap the backplane line in a plan view.

According to an embodiment, the display device may further include a first area in which the reflective pattern is disposed; and a second area in which the first electrode is disposed; the first area and the second area may not overlap each other in a plan view, at least a portion of the backplane line may overlap the first area in a plan view, and at least another portion of the backplane line may overlap the second area in a plan view.

According to an embodiment, the backplane line may provide an electrical signal to the light emitting element.

According to an embodiment, the first electrode may be electrically connected to an end of the light emitting element, the display device may further include a second electrode electrically connected to another end of the light emitting element and providing a cathode signal to the light emitting element, and the reflective pattern may be electrically connected to the second electrode.

According to an embodiment, the display device may further include a first sub pixel area that emits light of a first color, a second sub pixel area that emits light of a second color, and a third sub pixel area that emits light of a third color.

According to an embodiment, the display device may further include a first wavelength conversion pattern disposed in the first sub pixel area; a second wavelength conversion pattern disposed in the second sub pixel area; and a light transmission pattern disposed in the third sub pixel area, at least a first portion of the light emitting element may overlap the first sub pixel area, a second portion of the light emitting element may overlap the second sub pixel area, a third portion of the light emitting element may overlap the third sub pixel area, and the light emitting element may emit light of the third color.

According to an embodiment, the display device may further include a first gate electrode disposed between the substrate and the protective layer, and including at least a portion overlapping the through hole in a plan view.

According to an embodiment, the first gate electrode may include molybdenum (Mo).

According to an embodiment, the display device may further include a gate insulating layer disposed on the first gate electrode; and a second gate electrode disposed on the gate insulating layer, and the through hole may overlap the first gate electrode and the second gate electrode in a plan view.

According to an embodiment, through holes may be disposed along the first gate electrode in a plan view.

According to an embodiment, the display device may further include sub pixel areas that emit light of different colors, respectively, each of the through holes may be disposed in a first through area and a second through area overlapping at least a portion of the first gate electrode, in a plan view, the first through area may be disposed between adjacent sub pixel areas in a first direction, and the second through area may be disposed between adjacent sub pixel areas in a second direction intersecting the first direction.

According to an embodiment, a display device may include a protective layer disposed on a substrate; a first electrode disposed on the protective layer; a light emitting element electrically connected to the first electrode; and a reflective pattern disposed on the protective layer and including a reflective material, and a surface on which the light emitting element may be disposed and an upper surface of the reflective pattern may be a same height.

According to an embodiment, the display device may further include a connection electrode disposed between the first electrode and the light emitting element, and a distance between the upper surface of the reflective pattern and the substrate may be equal to a distance between an upper surface of the connection electrode and the substrate.

According to an embodiment, an oxide layer may be disposed on an outer surface of the reflective pattern, and the oxide layer may prevent a short circuit between the first electrode and the reflective pattern.

According to an embodiment of the disclosure, a method of manufacturing a display device may include disposing a backplane line on a substrate; forming a protective layer overlapping the backplane line; forming a reflective pattern including a reflective material on the protective layer; forming an insulating layer on the protective layer, and disposing a first electrode on the insulating layer; disposing a connection electrode on the first electrode; and disposing a light emitting element on the connection electrode, and the forming of the reflective pattern may include forming the reflective pattern to overlap the backplane line in a plan view.

According to an embodiment, the forming of the reflective pattern may include disposing the reflective pattern in an area overlapping the backplane line.

According to an embodiment, the forming of the reflective pattern may include forming a through hole in a hole shape in an area where the reflective pattern is not disposed, and the through hole may not overlap the backplane line in a plan view.

According to an embodiment, the disposing of the light emitting element on the connection electrode may include providing heat between the connection electrode and the light emitting element, and electrically connecting the connection electrode and the light emitting element.

According to an embodiment, the providing of the heat may include providing a laser between the connection electrode and the light emitting element.

According to an embodiment, the laser may have a wavelength band in a range of about 800 nm to about 1000 nm.

A solution means of the object of the disclosure is not limited to the above-described solution means, and solution means not described will be clearly understood by those skilled in the art from the specification and the accompanying drawings.

According to an embodiment of the disclosure, a display device and a method of manufacturing the same, in which damage to a line and an intermediate layer (via layer or the like) is prevented during a manufacturing process, by providing a reflective pattern overlapping the line, may be provided.

According to an embodiment, a display device and a method of manufacturing the same, in which alignment of a light emitting element is improved may be provided.

An effect of the disclosure is not limited to the above-described effects, and effects which are not described will be clearly understood by those skilled in the art from the specification and the accompanying drawings.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
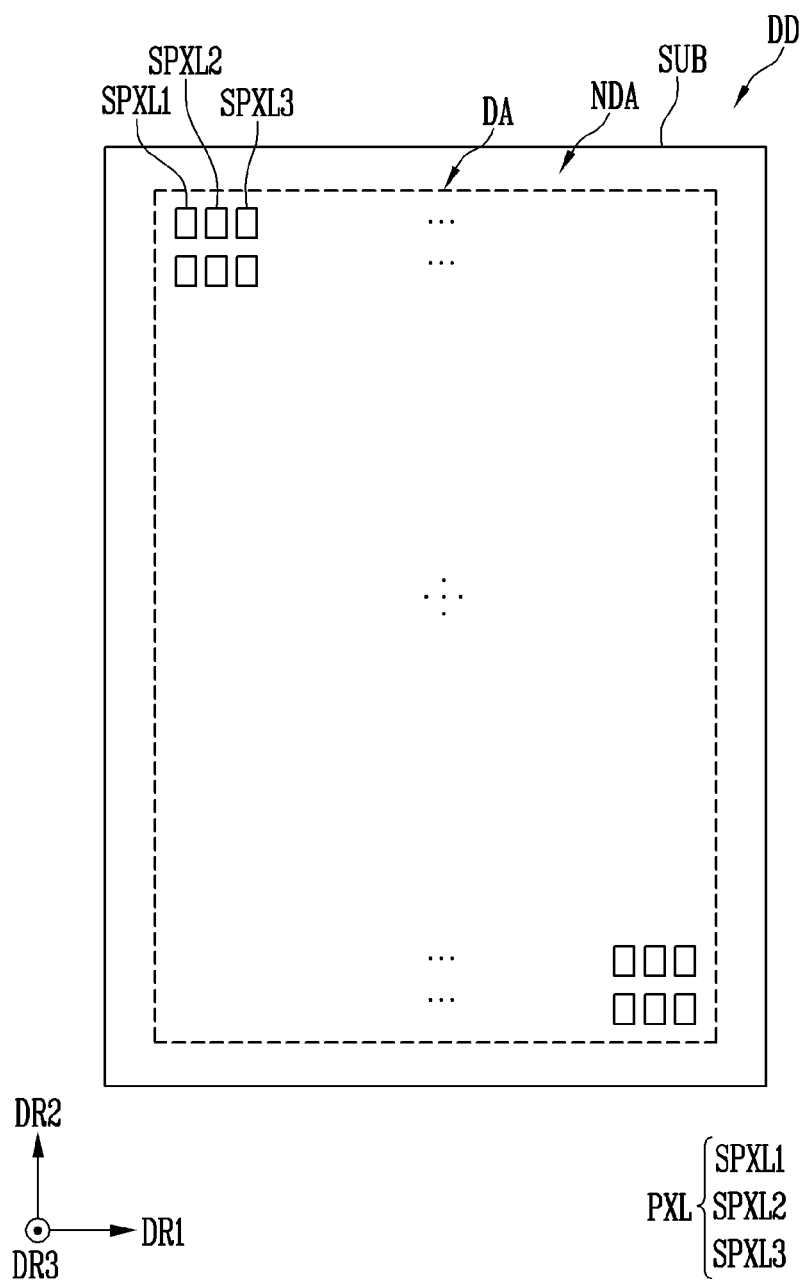
FIG. 1 is a schematic plan view schematically illustrating a display device according to an embodiment.

Since embodiments described in the specification are for clearly describing the spirit and scope of the disclosure to those skilled in the art to which the disclosure pertains, the disclosure is not limited by the described embodiments, and the scope of the disclosure should be interpreted as including modifications or variations included within the spirit and the scope of the disclosure.

The drawings are intended to readily describe the disclosure. Since the shape or shapes shown in the drawings may be exaggerated and displayed as necessary to help understanding of the disclosure, the disclosure is not limited by the drawings and/or the shape or shapes illustrated in the drawings.

For example, in the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In case that an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof in case that used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that in case that an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the specification, when it is determined that detailed description of a configuration or function related to the disclosure may obscure the subject matter of the disclosure, detailed description thereof may be omitted as necessary.

The disclosure relates to a display device and a method of manufacturing the same. Hereinafter, a display device and a method of manufacturing the same according to an embodiment are described with reference to FIGS. 1 to 18.

FIG. 1 is a schematic plan view schematically illustrating a display device according to an embodiment.

The display device DD according to an embodiment may emit light. Referring to FIG. 1, the display device DD may include a substrate SUB and a pixel PXL disposed on the substrate SUB. Although not shown in the drawing, the display device DD may further include a driving circuit unit (for example, a scan driver and a data driver) for driving the pixel PXL, lines, and pads.

According to an example, the pixel PXL may include a first sub pixel SPXL1, a second sub pixel SPXL2, and a third sub pixel SPXL3.

The display device DD may include a display area DA and a non-display area NDA. The non-display area NDA may mean an area other than the display area DA. The non-display area NDA may surround at least a portion of the display area DA or may be adjacent to the display area DA.

The substrate SUB may form a base member of the display device DD. The substrate SUB may be a rigid or flexible substrate or film, but is not limited to a specific or described example.

The display area DA may mean an area in which the pixel PXL is disposed. The non-display area NDA may mean an area in which the pixel PXL is not disposed. In the non-display area NDA, the driving circuit unit, the lines, and the pads connected to the pixel PXL of the display area DA may be disposed.

According to an example, the pixel PXL may be arranged or disposed according to a stripe or a PENTILE™ arrangement structure, but the disclosure is not limited thereto, and various embodiments may be applied.

According to an embodiment, the pixel PXL including sub pixels (refer to 'SPXL' of FIG. 5) may be disposed in the display area DA. For example, in the display area DA, the first sub pixel SPXL1 emitting light of a first color, the second sub pixel SPXL2 emitting light of a second color, and the third sub pixel SPXL3 emitting light of a third color may be arranged or disposed, and at least one of the first to third sub pixels SPXL1, SPXL2, and SPXL3 may form one pixel unit capable of emitting light of various colors.

For example, each of the first to third sub pixels SPXL1, SPXL2, and SPXL3 may be a sub pixel emitting light of a color. For example, the first sub pixel SPXL1 may be a red pixel emitting light of red (for example, a first color), the second sub pixel SPXL2 may be a green pixel emitting light of green (for example, a second color), and the third sub pixel SPXL3 may be a blue pixel emitting light of blue (for example, a third color). However, the color, type, number, and/or the like of the pixels PXL forming each pixel unit are/is not limited to a specific or described example.

Hereinafter, for convenience of description, an embodiment in which the pixel PXL may include the first to third sub pixels SPXL1, SPXL2, and SPXL3 is described. The sub pixel SPXL defined in the specification may be any one of the first to third sub pixels SPXL1, SPXL2, and SPXL3.

Figure 2:
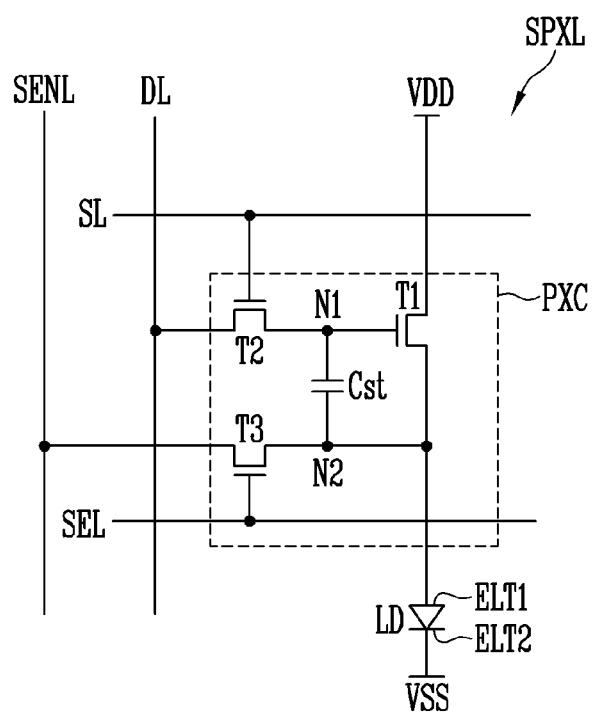
FIG. 2 is a schematic diagram of an equivalent circuit of a pixel circuit included in a pixel according to an embodiment.

FIG. 2 is a schematic diagram of an equivalent circuit of a pixel circuit included in a pixel according to an embodiment.

FIG. 2 shows an electrical connection relationship between components included in a sub pixel SPXL applied to an active display device DD as one of embodiments. However, a type of the components included in the sub pixel SPXL to which an embodiment of the disclosure may be applied is not limited thereto.

Referring to FIG. 2, the sub pixel SPXL may include the light emitting element LD and a pixel circuit PXC.

The light emitting element LD may be connected between a first power line VDD and a second power line VSS. One end portion (for example, a P-type semiconductor) of the light emitting element LD may be connected to the first power line VDD via a first electrode ELT1 and the pixel circuit PXC, and another end portion (for example, an N-type semiconductor) of the light emitting element LD may be connected to the second power line VSS via a second electrode ELT2.

According to an embodiment, in case that a driving current is supplied through the pixel circuit PXC, the light emitting element LD may emit light of a luminance corresponding to the driving current.

According to an embodiment, the light emitting elements LD may be connected to each other through various connection structures between the first power line VDD and the second power line VSS. For example, the light emitting elements LD may be connected to each other only in parallel or may be connected to each other only in series. By way of example, the light emitting elements LD may be connected in a series/parallel mixed structure.

The first power line VDD and the second power line VSS may have different potentials so that the light emitting elements LD may emit light. The first power line VDD and the second power line VSS may have a potential difference of a level at which light may be emitted during an emission period of the sub pixel SPXL. For example, the first power line VDD may be set to a potential higher than that of the second power line VSS.

The pixel circuit PXC may connect between the first power line VDD and the light emitting element LD. The pixel circuit PXC may include a first transistor T1, a second transistor T2, a third transistor T3, and a storage capacitor Cst.

According to an embodiment, one electrode of the first transistor T1 may be connected to the first power line VDD, and another electrode may be connected to one electrode (for example, an anode electrode) of the light emitting element LD. A gate electrode of the first transistor T1 may be connected to a first node N1. The first transistor T1 may control a current flowing through the light emitting element LD in response to a voltage applied through the first node N1.

According to an embodiment, one electrode of the second transistor T2 may be connected to a data line DL, and another electrode may be connected to the first node N1. A gate electrode of the second transistor T2 may be connected to a scan line SL. In case that a scan signal is supplied from the scan line SL, the second transistor T2 may be turned on, and at this time, the second transistor T2 may transmit a data signal provided from the data line DL to the first node N1.

According to an embodiment, one electrode of the third transistor T3 may be connected to a sensing line SENL, and another electrode may be connected to a second node N2. A gate electrode of the third transistor T3 may be connected to a sensing signal line SEL. In case that the third transistor T3 is turned on in response to a sensing signal provided from the sensing signal line SEL, a reference voltage may be provided to the second node N2 through the sensing line SENL.

According to an embodiment, the reference voltage may set or initialize a voltage of an electrode of the first transistor T1 connected to the light emitting element LD (for example, a source electrode of the first transistor T1) to a constant value. According to an example, the reference voltage may be set to be less than or equal to a voltage of the second power line VSS.

According to an embodiment, in case that the third transistor T3 is turned on in response to the sensing signal provided from the sensing signal line SEL, the third transistor T3 may transmit a sensing current to the sensing line SENL.

According to an embodiment, the sensing current may be used to calculate a mobility and a change amount of a threshold voltage of the first transistor T1.

The storage capacitor Cst may be connected between the first node N1 (or the gate electrode of the first transistor T1) and the second node N2 (or another electrode of the first transistor T1). The storage capacitor Cst may store information on a difference between a voltage of the first node N1 and a voltage of the second node N2.

A structure of the pixel circuit PXC is not limited to the structure shown in FIG. 2, and various types of structures may be implemented. In FIG. 2, the first to third transistors T1 to T3 are shown based on N-type transistors, but the disclosure is not limited thereto, and the first to third transistors T1 to T3 may be type transistors.

Hereinafter, a structure of the sub pixels SPXL forming the pixel PXL is described in more detail with reference to FIGS. 3 to 5. Contents that may be repetitive to the above-described contents are briefly described or omitted.

Figure 3:
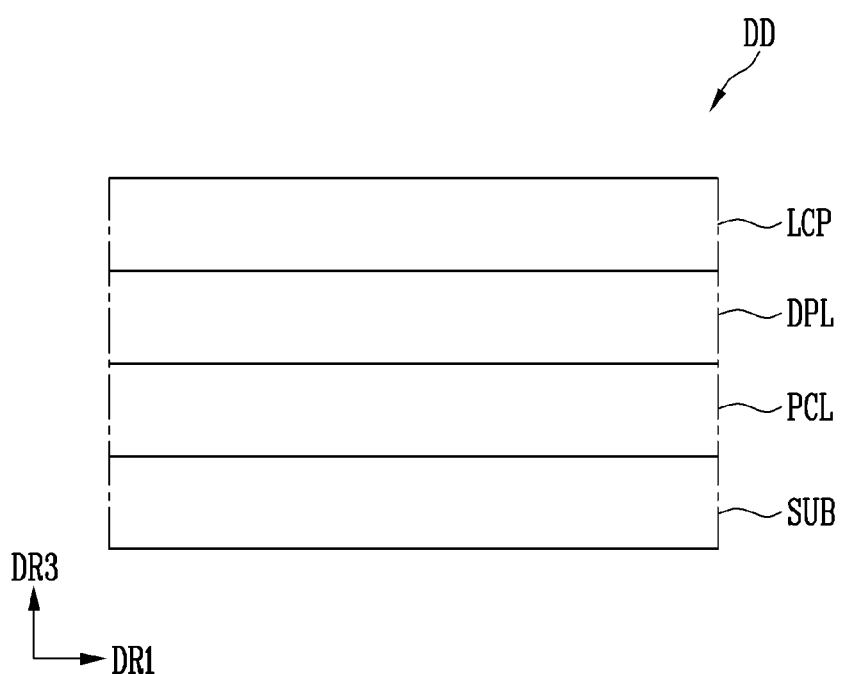
FIG. 3 is a schematic cross-sectional view illustrating a display device according to an embodiment.

FIG. 3 is a schematic cross-sectional view illustrating a display device according to an embodiment.

Referring to FIG. 3, the display device DD may include the substrate SUB, a pixel circuit part PCL, a display element part DPL, and a light control portion LCP.

According to an example, the substrate SUB, the pixel circuit part PCL, the display element part DPL, and the light control portion LCP may be sequentially stacked each other according to a display direction (for example, a third direction DR3) of the display device DD. Here, the display direction may mean a thickness direction of the substrate SUB.

The substrate SUB may form a base surface of the display device DD. An individual configuration of the display device DD may be disposed on the substrate SUB.

The pixel circuit part PCL may be disposed on the substrate SUB. The pixel circuit part PCL may include the pixel circuit PXC to drive the pixel PXL.

The display element part DPL may be disposed on the pixel circuit part PCL. The display element part DPL may emit light based on an electrical signal provided from the pixel circuit part PCL. The display element part DPL may include a light emitting element (refer to 'LD' of FIG. 4) capable of emitting light. The light emitted from the display element part DPL may pass through the light control portion LCP and may be provided to an outside.

The light control portion LCP may be disposed on the display element part DPL. The light control portion LCP may be disposed on the light emitting elements LD. The light control portion LCP may change a wavelength of the light provided from the display element part DPL (or the light emitting elements LD). According to an example, as shown in FIG. 5, the light control portion LCP may include a color conversion portion CCL to change the wavelength of the light and a color filter portion CFL that transmits light of a specific or given wavelength.

Hereinafter, a structure of the sub pixels SPXL included in the pixel PXL is described in more detail with reference to FIGS. 4 and 5. Contents that may be repetitive to the above-described contents are briefly described or omitted.

Figure 4:
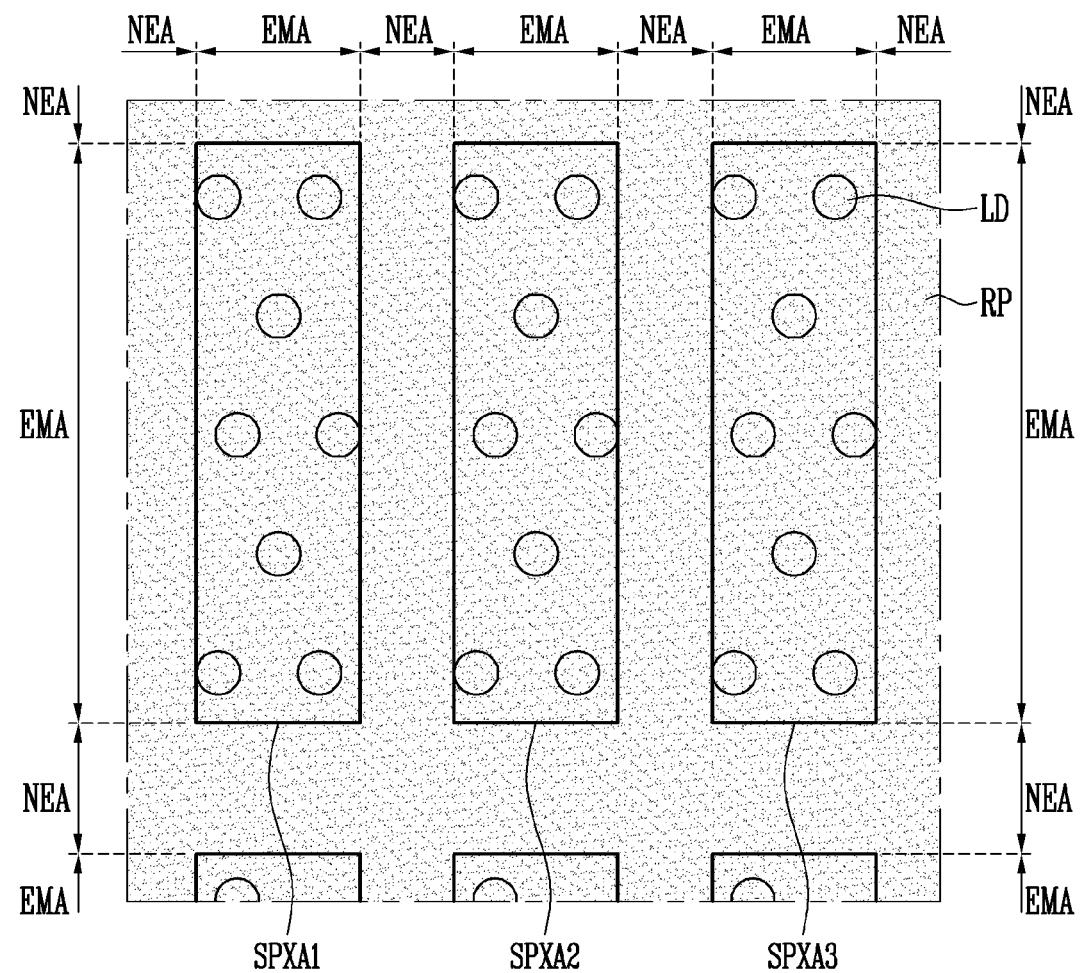
FIG. 4 is a schematic plan view schematically illustrating a structure of a pixel according to an embodiment.

With reference to FIG. 4, the sub pixels SPXL included in the pixel PXL according to an embodiment are described based on a plan view.

FIG. 4 is a schematic plan view schematically illustrating a structure of a pixel according to an embodiment.

Referring to FIG. 4, the pixel PXL may include an emission area EMA and a non-emission area NEA.

The emission area EMA may mean an area from which light is emitted, and the non-emission area NEA may mean an area from which light is not emitted. The emission area EMA and the non-emission area NEA may be defined by a light blocking layer (refer to 'LBL' of FIG. 5). Details thereof are described later with reference to FIG. 5.

According to an embodiment, a first sub pixel area SPXA1, a second sub pixel area SPXA2, and a third sub pixel area SPXA3 may be disposed to be spaced apart from each other. According to an example, the first sub pixel area SPXA1, the second sub pixel area SPXA2, and the third sub pixel area SPXA3 may extend in a second direction DR2 and may be spaced apart from each other in a first direction DR1.

Light emitting elements LD may be provided and may be disposed (or arranged) in the emission area EMA. For example, the light emitting elements LD may be disposed on the first sub pixel area SPXA1, the second sub pixel area SPXA2, and the third sub pixel area SPXA3.

According to an embodiment, the first sub pixel area SPXA1 may mean the emission area EMA of the first sub pixel SPXL1. The second sub pixel area SPXA2 may mean the emission area EMA of the second sub pixel SPXL2. The third sub pixel area SPXA3 may mean the emission area EMA of the third sub pixel SPXL3.

According to an embodiment, the pixel PXL may include a reflective pattern RP. The reflective pattern RP may include a reflective material and may reflect light.

The reflective pattern RP may be disposed on the entire surface of the pixel PXL. For example, a portion of the reflective pattern RP may be disposed in the emission area EMA, and another portion of the reflective pattern RP may be disposed in the non-emission area NEA.

For example, the reflective pattern RP may be disposed in each of the first sub pixel area SPXA1, the second sub pixel area SPXA2, and the third sub pixel area SPXA3, and may also be disposed outside the first sub pixel area SPXA1, the second sub pixel area SPXA2, and the third sub pixel area SPXA3.

Figure 5:
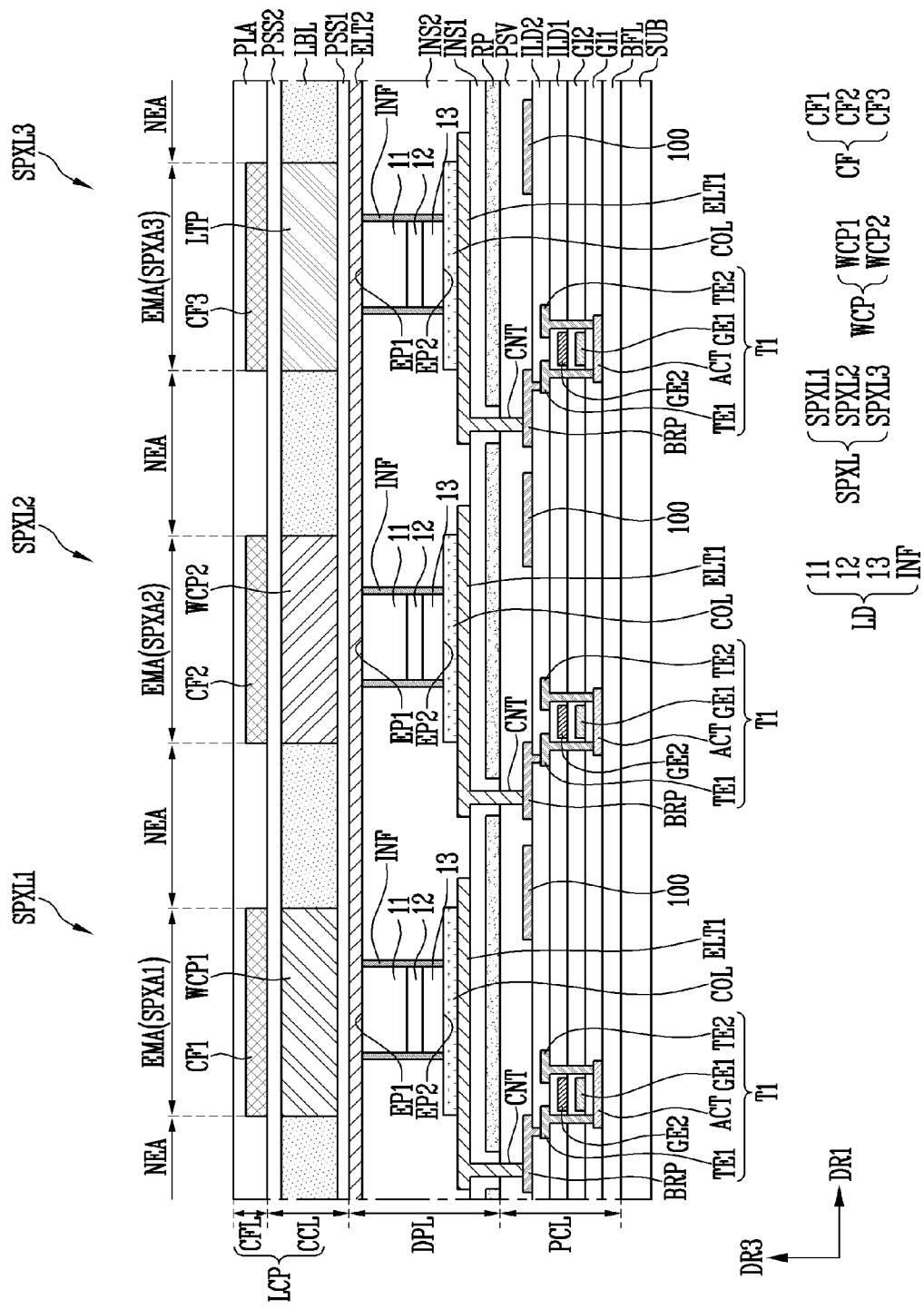
FIG. 5 is a schematic cross-sectional view schematically illustrating a structure of a pixel according to an embodiment.

With reference to FIG. 5, the sub pixels SPXL included in the pixel PXL according to an embodiment is described based on a schematic cross-sectional view.

FIG. 5 is a schematic cross-sectional view schematically illustrating a structure of a pixel according to an embodiment. FIG. 5 shows the first sub pixel SPXL1, the second sub pixel SPXL2, and the third sub pixel SPXL3. In FIG. 5, an embodiment in which the first transistor T1 is provided in each of the first sub pixel SPXL1, the second sub pixel SPXL2, and the third sub pixel SPXL3 is shown.

The pixel circuit part PCL may be disposed on the substrate SUB. The pixel circuit part PCL may include a buffer layer BFL, the first transistor T1, a first gate insulating layer GI1, a second gate electrode GE2, a second gate insulating layer GI2, a first interlayer insulating layer ILD1, a second interlayer insulating layer ILD2, a bridge pattern BRP, a backplane line 100, a protective layer PSV, and a portion of a contact portion CNT.

According to an example, individual configurations of the pixel circuit part PCL may be defined in each of the first to third sub pixels SPXL1, SPXL2, and SPXL3.

The buffer layer BFL may be disposed on the substrate SUB. The buffer layer BFL may prevent an impurity from being diffused from an outside. The buffer layer BFL may include at least one of metal oxides such as silicon nitride ($SiN_x$), silicon oxide ($SiO_x$), silicon oxynitride ($SiO_xN_y$), and aluminum oxide ($AlO_x$).

The first transistor T1 may be a thin film transistor. According to an embodiment, the first transistor T1 may be a driving transistor.

According to an embodiment, the first transistor T1 may be electrically connected to the light emitting element LD. For example, the first transistor T1 of the first sub pixel SPXL1 may be electrically connected to the light emitting element LD disposed in a first sub pixel area SPXA1. The first transistor T1 of the second sub pixel SPXL2 may be electrically connected to the light emitting element LD disposed in a second sub pixel area SPXA2. The first transistor T1 of the third sub pixel SPXL3 may be electrically connected to the light emitting element LD disposed in a third sub pixel area SPXA3.

According to an embodiment, the first transistor T1 may include an active layer ACT, a first transistor electrode TE1, a second transistor electrode TE2, and a first gate electrode GE1.

The active layer ACT may mean a semiconductor layer. The active layer ACT may be disposed on the buffer layer BFL. The active layer ACT may include at least one of polysilicon, amorphous silicon, low-temperature polycrystalline silicon, and oxide semiconductor.

According to an embodiment, the active layer ACT may include a first contact region that is in contact with the first transistor electrode TE1 and a second contact region that is in contact with the second transistor electrode TE2. The first contact region and the second contact region may be a semiconductor pattern doped with an impurity. A region between the first contact region and the second contact region may be a channel region. The channel region may be an intrinsic semiconductor pattern that is not doped with an impurity.

The first gate electrode GE1 may be disposed on the first gate insulating layer GI1. A position of the first gate electrode GE1 may correspond to a position of the channel region of the active layer ACT. For example, the first gate electrode GE1 may be disposed on the channel region of the active layer ACT with the first gate insulating layer GI1 interposed therebetween.

The first gate insulating layer GI1 may be disposed on the active layer ACT. The first gate insulating layer GI1 may include an inorganic material. According to an example, the first gate insulating layer GI1 may include at least one of silicon nitride ($SiN_x$), silicon oxide ($SiO_x$), silicon oxynitride ($SiO_xN_y$), and aluminum oxide ($AlO_x$). According to an embodiment, the first gate insulating layer GI1 may include an organic material.

The second gate insulating layer GI2 may be disposed on the first gate electrode GE1. The second gate insulating layer GI2 may include an inorganic material. According to an example, the second gate insulating layer GI2 may include at least one of silicon nitride (SiNx), silicon oxide (SiOx), silicon oxynitride (SiOxNy), and aluminum oxide (AlOx). According to an embodiment, the second gate insulating layer GI2 may include an organic material.

The second gate electrode GE2 may be disposed on the second gate insulating layer GI2. The second gate electrode GE2 may overlap the first gate electrode GE1 with the second gate insulating layer GI2 interposed therebetween.

According to an embodiment, the first gate electrode GE1 and the second gate electrode GE2 may include a conductive material. For example, the first gate electrode GE1 and the second gate electrode GE2 may include any one of aluminum (Al), copper (Cu), titanium (Ti), and molybdenum (Mo).

According to an embodiment, the first gate electrode GE1 and the second gate electrode GE2 may include a conductive material that is resistant to temperature. For example, in case that the active layer ACT is provided as the LIPS, an ambient temperature may be high in case that a process in which the first gate electrode GE1 and the second gate electrode GE2 are disposed is performed. Accordingly, the first gate electrode GE1 and the second gate electrode GE2 are required to include a material that is resistant to temperature so that an effect due to temperature is reduced. According to an example, in order to reduce the effect due to temperature, the first gate electrode GE1 and the second gate electrode GE2 may include molybdenum (Mo).

The first interlayer insulating layer ILD1 may be positioned on the second gate electrode GE2. Similar to the first gate insulating layer GI1, the first interlayer insulating layer ILD1 may include at least one of silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be positioned on the first interlayer insulating layer ILD1. The first transistor electrode TE1 may pass through the first gate insulating layer GI1, the second gate insulating layer GI2, and the first interlayer insulating layer ILD1 and may be in contact with the first contact region of the active layer ACT, and the second transistor electrode TE2 may pass through the first gate insulating layer GI1, the second gate insulating layer GI2, and the first interlayer insulating layer ILD1 and may be in contact with the second contact region of the active layer ACT. According to an example, the first transistor electrode TE1 may be a drain electrode, and the second transistor electrode TE2 may be a source electrode, but the disclosure is not limited thereto.

The second interlayer insulating layer ILD2 may be positioned on the first transistor electrode TE1 and the second transistor electrode TE2. Similar to the first interlayer insulating layer ILD1, the second interlayer insulating layer ILD2 may include an inorganic material. The inorganic material may include at least one of the materials for example as the configuration material of the first interlayer insulating layer ILD1 and the first gate insulating layer GI1, for example, silicon nitride ($SiN_x$), silicon oxide ($SiO_x$), silicon oxynitride ($SiO_xN_y$), and aluminum oxide ($AlO_x$).

The bridge pattern BRP may be disposed on the second interlayer insulating layer ILD2. The bridge pattern BRP may be connected to the first transistor electrode TE1 through a contact hole passing through the second interlayer insulating layer ILD2. According to an example, the bridge pattern BRP may include a conductve material.

The backplane line 100 may be disposed on the substrate SUB. The backplane line 100 may be disposed on the second interlayer insulating layer ILD2. The backplane line 100 may be a path through which an electrical signal provided to the pixel PXL moves.

The backplane line 100 may include a conductive material. According to an example, the backplane line 100 may be formed of a single layer selected from a group consisting of copper (Cu), molybdenum (Mo), tungsten (W), aluminum neodymium (AlNd), titanium (Ti), aluminum (Al), silver (Ag), and an alloy thereof alone or a mixture thereof, or may be formed of a double-layer or multi-layer structure of molybdenum (Mo), titanium (Ti), copper (Cu), aluminum (Al), or silver (Ag), which is a low-resistance material in order to reduce a line resistance.

An electrical signal moving in the pixel circuit part PCL may move through the backplane line 100. According to an example, the scan signal, the data signal, and/or power provided to the sub pixel SPXL may be moved through the backplane line 100. The cathode signal provided to the light emitting element LD may move through the backplane line 100.

According to an embodiment, the backplane line 100 may be formed in the same process as the bridge pattern BRP, and may include the same material or a similar material as the bridge pattern BRP.

According to an embodiment, the backplane line 100 may overlap the reflective pattern RP in a plan view. Details thereof are described later with reference to FIG. 6.

The protective layer PSV may be positioned on the second interlayer insulating layer ILD2. The protective layer PSV may be a via layer. The protective layer PSV may cover or overlap the bridge pattern BRP and the backplane line 100.

The protective layer PSV may be provided in a form including an organic insulating layer, an inorganic insulating layer, or the organic insulating layer disposed on the inorganic insulating layer, but is not limited thereto. According to an embodiment, at least a portion of the contact portion CNT connected to one region of the bridge pattern BRP may be formed in the protective layer PSV.

The contact portion CNT may be formed through the protective layer PSV and a first insulating layer INS1. Accordingly, the first electrode ELT1 disposed on the first insulating layer INS1 may be electrically connected to the bridge pattern BRP through the contact portion CNT.

The display element part DPL may be disposed on the pixel circuit part PCL. The display element part DPL may include the reflective pattern RP, the first insulating layer INS1, at least a portion of the contact portion CNT, the first electrode ELT1, a connection electrode COL, the light emitting element LD, and the second electrode ELT2.

According to an example, individual configurations of the display element part DPL may be defined in each of the first to third sub pixels SPXL1, SPXL2, and SPXL3. Hereinafter, for convenience of description, individual configurations of the display element part DPL defined in each of the first to third sub pixels SPXL1, SPXL2, and SPXL3 are inclusively described.

The reflective pattern RP may be disposed on the display element part DPL. The reflective pattern RP may be disposed on the protective layer PSV. The reflective pattern RP may be interposed between the protective layer PSV and the first insulating layer INS1. The reflective pattern RP may be covered or overlapped by the first insulating layer INS1.

According to an embodiment, the reflective pattern RP may include a reflective material. The reflective pattern RP may include an opaque metal. For example, the reflective pattern RP may include at least one of aluminum (Al), molybdenum (Mo), copper (Cu), silver (Ag), magnesium (Mg), platinum (Pt), palladium (Pd), gold (Au), nickel (Ni), neodymium (Nd), iridium (Ir), chromium (Cr), titanium (Ti), and an alloy thereof.

According to an embodiment, the reflective pattern RP may have a thickness to have a reflective property. The thickness may be a thickness suitable for reflecting a laser (refer to '500' of FIG. 14) for bonding the light emitting element LD to the connection electrode COL. According to an example, the thickness may be about 300 Å or more.

According to an embodiment, although not shown in a separate drawing, the reflective pattern RP may be electrically connected to the second electrode ELT2 to provide the cathode signal. Accordingly, the reflective pattern RP may prevent distortion of the electrical signal provided to the light emitting element LD.

According to an embodiment, at least a portion of the reflective pattern RP may overlap the backplane line 100 in a plan view. Accordingly, during a manufacturing process of the display device DD, in case that the laser 500 for bonding the light emitting element LD to the connection electrode COL is irradiated, the backplane line 100 may be prevented from the irradiated laser 500. Details thereof are described later with reference to FIG. 14.

The first insulating layer INS1 may be disposed on the protective layer PSV. The first insulating layer INS1 may cover or overlap the reflective pattern RP. At least a portion of the first insulating layer INS1 may be interposed between the first electrode ELT1 and the reflective pattern RP to stabilize an electrical connection.

According to an embodiment, the first insulating layer INS1 may include at least one insulating material among silicon oxide ($SiO_x$), silicon nitride ($SiN_x$), silicon oxynitride ($SiO_xN_y$), aluminum oxide ($AlO_x$), and titanium oxide ($TiO_x$) and may be formed of a single layer or multiple layers.

According to an embodiment, the contact portion CNT may pass through a portion of the first insulating layer INS1. The first electrode ELT1 may be disposed on the first insulating layer INS1. The first electrode ELT1 may be interposed between the connection electrode COL and the first insulating layer INS1.

According to an embodiment, the first electrode ELT1 may include a conductive material. For example, the first electrode ELT1 may include at least one of aluminum (Al), molybdenum (Mo), copper (Cu), silver (Ag), magnesium (Mg), platinum (Pt), palladium (Pd), gold (Au), nickel (Ni), neodymium (Nd), iridium (Ir), chromium (Cr), titanium (Ti), and an alloy thereof. However, the first electrode ELT1 is not limited to the above-described example.

According to an embodiment, the first electrode ELT1 may be electrically connected to the bridge pattern BRP. For example, the first electrode ELT1 may be electrically connected to the bridge pattern BRP through the contact portion CNT passing through the first insulating layer INS1 and the protective layer PSV.

According to an embodiment, the first electrode ELT1 may provide an electrical signal to the light emitting element LD. The first electrode ELT1 may be electrically connected to a second semiconductor layer 13. For example, the first electrode ELT1 may provide an anode signal provided from the first transistor T1 to the light emitting element LD.

The connection electrode COL may be disposed on the first electrode ELT1. The connection electrode COL may be interposed between the light emitting element LD and the first electrode ELT1.

According to an embodiment, the connection electrode COL may be connected or coupled to the light emitting element LD. For example, one surface or a surface of the connection electrode COL may be connected to the light emitting element LD, and another surface of the connection electrode COL may be connected to the first electrode ELT1.

According to an embodiment, the connection electrode COL may include a conductive material to electrically connect the first electrode ELT1 and the light emitting element LD.

According to an embodiment, the connection electrode COL may be a bonding metal that is bonding-combined to another component. For example, after the light emitting element LD is disposed on the connection electrode COL, heat may be applied (for example, the laser 500 may be irradiated) to a region between the connection electrode COL and the light emitting element LD to combine the connection electrode COL and the light emitting element LD.

The light emitting element LD may be disposed on the connection electrode COL and emit light. The light emitting element LD may be positioned between the first electrode ELT1 and the second electrode ELT2.

According to an embodiment, the light emitting element LD may be included in each of the first to third sub pixels SPXL1, SPXL2, and SPXL3. Light emitting elements LD may be provided to be disposed in each of the first to third sub pixel areas SPXA1, SPXA2, and SPXA3. However, in FIG. 5, for convenience of description, one light emitting element LD is disposed in each of the first to third sub pixel areas SPXA1, SPXA2, and SPXA3.

According to an embodiment, the light emitting element LD may be provided in a substantially column shape extending along one direction or a direction. The light emitting element LD may have a first end portion EP1 and a second end portion EP2. A first semiconductor layer 11 may be adjacent to the first end portion EP1 of the light emitting element LD. The second semiconductor layer 13 may be adjacent to the second end portion EP2 of the light emitting element LD.

According to an embodiment, the light emitting element LD may be a light emitting element manufactured in a column shape through an etching method or the like within the spirit and the scope of the disclosure. In the specification, the term "column shape" encompasses a rod-like shape or a bar-like shape that is long in a length direction (for example, an aspect ratio is greater than 1), such as a circular column or a polygonal column, and a shape of a cross section is not particularly limited. For example, a length of the light emitting element LD may be greater than a diameter (or a width of the cross section) thereof. The shapes described in the specification also include substantially the shapes described.

According to an embodiment, the light emitting element LD may have a size as small as nano scale to micro scale (nanometer scale to micrometer scale). For example, each of the light emitting elements LD may have a diameter (or width) and/or a length of a nano scale to micro scale range. However, the size of the light emitting element LD is not limited thereto.

According to an embodiment, the light emitting element LD may include the first semiconductor layer 11, the second semiconductor layer 13, and an active layer 12 interposed between the first and second semiconductor layers 11 and 13.

The first semiconductor layer 11 may be a first conductivity type semiconductor layer. For example, the first semiconductor layer 11 may include an N-type semiconductor layer. For example, the first semiconductor layer 11 may include any one semiconductor material among InAlGaN, GaN, AlGaN, InGaN, AlN, and InN, and may include an N-type semiconductor layer doped with a first conductivity type dopant such as Si, Ge, and Sn. However, the material forming the first semiconductor layer 11 is not limited thereto.

The active layer 12 may be disposed on the first semiconductor layer 11 and may be formed in a single-quantum well or multi-quantum well structure. For example, in case that the active layer 12 is formed in the multi-quantum well structure, in the active layer 12, a barrier layer, a strain reinforcing layer, and a well layer may be repeatedly stacked each other periodically as one unit. The strain reinforcing layer may have a lattice constant smaller than that of the barrier layer, and thus may further reinforce a strain, for example, a compression strain, applied to the well layer. However, a structure of the active layer 12 is not limited to the above-described embodiment.

According to an embodiment, the active layer 12 may emit light having a wavelength in a range of about 400 nm to about 900 nm. According to an example, the active layer 12 may include a material such as AlGaN and InAlGaN, but is not limited to the above-described example.

The second semiconductor layer 13 may be disposed on the active layer 12 and may include a semiconductor layer of a type different from that of the first semiconductor layer 11. For example, the second semiconductor layer 13 may include a P-type semiconductor layer. For example, the second semiconductor layer 13 may include at least one semiconductor material among InAlGaN, GaN, AlGaN, InGaN, AlN, and InN, and may include a P-type semiconductor layer doped with a second conductivity type dopant such as Mg. However, the material forming the second semiconductor layer 13 is not limited thereto, and various other materials may form the second semiconductor layer 13.

In case that a voltage greater than or equal to a threshold voltage is applied to both ends of the light emitting element LD, electron-hole pairs are combined in the active layer 12, and thus the light emitting element LD emits light. By controlling the light emission of the light emitting element LD using this principle, the light emitting element LD may be used as a light source of various light emitting devices including a pixel of a display device.

According to an embodiment, the light emitting element LD may further include an insulating film INF. The insulating film INF may be disposed on an outer surface of the light emitting element LD to stabilize an electrical connection.

According to an example, the insulating film INF may include an inorganic material. For example, the insulating film INF may be a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$).

Although it is illustrated that each of the first semiconductor layer 11 and the second semiconductor layer 13 may be formed as one layer or as a layer, the disclosure is not limited thereto. In an embodiment, according to a material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain alleviating layer disposed between semiconductor layers having different lattice structures to serve as a buffer to reduce a lattice constant difference. The TSBR layer may be a p-type semiconductor layer such as p-GaInP, p-AlInP, or p-AlGaInP, but the disclosure is not limited thereto.

According to an embodiment, each light emitting element LD may further include a first contact electrode disposed on the first semiconductor layer 11 and/or a second contact electrode disposed on the second semiconductor layer 13 in addition to the above-described configurations.

According to an embodiment, the light emitting element LD may be electrically connected to the first electrode ELT1 and the second electrode ELT2. Accordingly, the light emitting element LD may emit light based on a first electrical signal (for example, the anode signal) provided from the first electrode ELT1 and a second electrical signal (for example, the cathode signal) provided from the second electrode ELT2.

A second insulating layer INS2 may be disposed on the first insulating layer INS1. The second insulating layer INS2 may cover or overlap at least a portion of the first electrode ELT1 and the connection electrode COL. According to an example, the second insulating layer INS2 may include any one of the inorganic materials listed with reference to the first insulating layer INS1.

According to an embodiment, the second insulating layer INS2 may be provided between the light emitting elements LD. The second insulating layer INS2 may be positioned between the light emitting elements LD to cover or overlap an outer surface of the light emitting elements LD. According to an example, the second insulating layer INS2 may function as a planarization layer for alleviating a step difference between configurations disposed in the display element part DPL.

The second electrode ELT2 may be disposed on the second insulating layer and the light emitting element LD. The second electrode ELT2 may be disposed adjacent to the first semiconductor layer 11.

According to an embodiment, the second electrode ELT2 may include a conductive material. The second electrode ELT2 may include a transparent conductive material. For example, the second electrode ELT2 may include any one of a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene)).

According to an embodiment, the second electrode ELT2 may be electrically connected to the light emitting element LD. Although not shown in the drawing, the second electrode ELT2 may be electrically connected to another line providing the cathode signal.

According to an embodiment, the second electrode ELT2 may provide the electrical signal to the light emitting element LD. The second electrode ELT2 may be electrically connected to the first semiconductor layer 11. For example, the second electrode ELT2 may provide the cathode signal provided from the other line to the light emitting element LD.

The light control portion LCP may be disposed on the display element part DPL. The light control portion LCP may change a wavelength of light provided from the display element part DPL. The light control portion LCP may include a color conversion portion CCL and a color filter portion CFL.

According to an embodiment, the light emitting elements LD disposed in each of the first sub pixel SPXL1, the second sub pixel SPXL2, and the third sub pixel SPXL3 may emit light of the same color.

For example, the first sub pixel SPXL1, the second sub pixel SPXL2, and the third sub pixel SPXL3 may include light emitting elements LD emitting light of a third color, for example, blue light. The light control portion LCP may be disposed on the first sub pixel SPXL1, the second sub pixel SPXL2, and the third sub pixel SPXL3 to display a full-color image. However, the disclosure is not limited thereto, and the first sub pixel SPXL1, the second sub pixel SPXL2, and the third sub pixel SPXL3 may include light emitting elements LD emitting light of different colors.

The color conversion portion CCL may define the first to third sub pixel areas SPXA1, SPXA2, and SPXA3. According to an embodiment, the color conversion portion may include a first wavelength conversion pattern WCP1, a second wavelength conversion pattern WCP2, a light transmission pattern LTP, and the light blocking layer LBL.

The first passivation layer PSS1 may be disposed between the display element part DPL and the light blocking layer LBL or the wavelength conversion pattern WCP. The first passivation layer PSS1 may seal (or cover or overlap) the wavelength conversion pattern WCP. The first passivation layer PSS1 may include any one of materials listed with reference to the first insulating layer INS1, but is not limited to a specific or described example.

Although not shown in the drawing, an adhesive layer may be interposed between the first passivation layer PSS1 and the second electrode ELT2. The adhesive layer may combine the first passivation layer PSS1 and the second electrode ELT2. The adhesive layer may include any adhesive material, and is not limited to a specific or described example.

The first wavelength conversion pattern WCP1 may be disposed to overlap an emission area EMA (for example, the first sub pixel area SPXA1) of the first sub pixel SPXL1.

For example, the first wavelength conversion pattern WCP1 may be disposed in a space defined by the light blocking layer LBL and may overlap the first sub pixel area SPXA1 in a plan view. For example, the light blocking layer LBL may include walls or banks, and the first wavelength conversion pattern WCP1 may be provided in a space between the walls disposed in an area corresponding to the first sub pixel SPXL1.

The second wavelength conversion pattern WCP2 may be disposed to overlap the emission area EMA (for example, the second sub pixel area SPXA2) of the second sub pixel SPXL2.

For example, the second wavelength conversion pattern WCP2 may be disposed in a space defined by the light blocking layer LBL and may overlap the second sub pixel area SPXA2 in a plan view. For example, the light blocking layer LBL may include walls, and the second wavelength conversion pattern WCP2 may be provided in a space between the walls disposed in an area corresponding to the second sub pixel SPXL2.

The light transmission pattern LTP may be disposed to overlap the emission area EMA (for example, the third sub pixel area SPXA3) of the third sub pixel SPXL3.

For example, the light transmission pattern LTP may be disposed in a space defined by the light blocking layer LBL and may overlap the third sub pixel area SPXA3 in a plan view. For example, the light blocking layer LBL may include walls, and the light transmission pattern LTP may be provided in a space between the walls disposed in an area corresponding to the third sub pixel SPXL3.

According to an embodiment, the first wavelength conversion pattern WCP1 may include first color conversion particles that convert light of a third color emitted from the light emitting element LD into light of a first color. For example, in case that the light emitting element LD is a blue light emitting element emitting blue light and the first sub pixel SPXL1 is a red pixel, the first wavelength conversion pattern WCP1 may include a first quantum dot that converts the blue light emitted from the blue light emitting element into red light.

For example, the first wavelength conversion pattern WCP1 may include first quantum dots dispersed in a matrix material such as a base resin. The first quantum dot may absorb the blue light and shift a wavelength according to an energy transition to emit the red light. In case that the first sub pixel SPXL1 is a pixel of a different color, the first wavelength conversion pattern WCP1 may include a first quantum dot corresponding to the color of the first sub pixel SPXL1.

According to an embodiment, the second wavelength conversion pattern WCP2 may include second color conversion particles that convert light of a third color emitted from the light emitting element LD into light of a second color. For example, in case that the light emitting element LD is a blue light emitting element emitting blue light and the second sub pixel SPXL2 is a green pixel, the second wavelength conversion pattern WCP2 may include a second quantum dot that converts the blue light emitted from the blue light emitting element light into green light.

For example, the second wavelength conversion pattern WCP2 may include second quantum dots dispersed in a matrix material such as a base resin. The second quantum dot may absorb the blue light and shift a wavelength according to an energy transition to emit the green light. In case that the second sub pixel SPXL2 is a pixel of a different color, the second wavelength conversion pattern WCP2 may include a second quantum dot corresponding to the color of the second sub pixel SPXL2.

The first quantum dot and the second quantum dot may have a shape of a globular shape, a pyramid shape, a multi-arm, or a cubic nanoparticle, a nanotube, a nanowire, a nanofiber, a nanoplate particle, or the like, but is not limited thereto, and the shape of the first quantum dot and the second quantum dot may be variously changed.

In an embodiment, an absorption coefficient of the first quantum dot and the second quantum dot may be increased by injecting the blue light having a relatively short wavelength in a visible light area to each of the first quantum dot and the second quantum dot. Accordingly, finally, efficiency of light emitted from the first sub pixel SPXL1 and the second sub pixel SPXL2 may be increased, and excellent color reproducibility may be secured. Manufacturing efficiency of the display device may be increased by forming the pixel unit of the first to third sub pixels SPXL1, SPXL2, and SPXL3 using the light emitting elements LD (for example, blue light emitting elements) of the same color.

According to an embodiment, the light transmission pattern LTP may be provided to efficiently use the light of the third color emitted from the light emitting element LD. For example, in case that the light emitting element LD is a blue light emitting element emitting blue light and the third sub pixel SPXL3 is a blue pixel, the light transmission pattern LTP may include at least one type of light scattering particles in order to efficiently use the light emitted from the light emitting element LD.

For example, the light transmission pattern LTP may include light scattering particles dispersed in a matrix material such as a base resin. For example, the light transmission pattern LTP may include light scattering particles such as silica, but a configuration material of the light scattering particles is not limited thereto. The light scattering particles may not be disposed in the third sub pixel area SPXA3 in which the third sub pixel SPXL3 is formed. For example, the light scattering particles may be selectively included in the first wavelength conversion pattern WCP1 and/or the second wavelength conversion pattern WCP2.

According to an embodiment, the light blocking layer LBL may be disposed on the display element part DPL. The light blocking layer LBL may be disposed on the substrate SUB. The light blocking layer LBL may be disposed between the first passivation layer PSS1 and the second passivation layer PSS2. The light blocking layer LBL may be disposed to surround the first wavelength conversion pattern WCP1, the second wavelength conversion pattern WCP2, and the light transmission pattern LTP at a boundary between the first to third sub pixels SPXL1, SPXL2, and SPXL3.

According to an embodiment, the light blocking layer LBL may define the emission area EMA and the non-emission area NEA of the first to third sub pixel SPXL1, SPXL2, and SPXL3. The light blocking layer LBL included in the color conversion portion CCL may define the first to third sub pixel areas SPXA1, SPXA2, and SPXA3.

For example, the light blocking layer LBL may not overlap the emission area EMA in a plan view. The light blocking layer LBL may overlap the non-emission area NEA in a plan view.

According to an embodiment, an area in which the light blocking layer LBL is not disposed may be defined as the emission area EMA of the first to third sub pixels SPXL1, SPXL2, and SPXL3.

According to an embodiment, the light blocking layer LBL may be formed of an organic material including at least one of graphite, carbon black, black pigment, or black dye, or may be formed of a metal material including chromium (Cr), but is not limited as long as the material of the light blocking layer LBL is a material capable of blocking light transmission and absorbing light.

The second passivation layer PSS2 may be disposed between the color filter portion CFL and the light blocking layer LBL. The second passivation layer PSS2 may seal (or cover or overlap) the first wavelength conversion pattern WCP1, the second wavelength conversion pattern WCP2, and the light transmission pattern LTP. The second passivation layer PSS2 may include any one of materials listed with reference to the first insulating layer INS1, but is not limited to a specific or described example.

The color filter portion CFL may be disposed on the color conversion portion CCL. The color filter portion CFL may include a color filter CF and a planarization layer PLA. Here, the color filter CF may include a first color filter CF1, a second color filter CF2, and a third color filter CF3.

The color filter CF may be disposed on the second passivation layer PSS2. In a plan view, the color filter CF may overlap the emission area EMA of the first to third sub pixels SPXL1, SPXL2, and SPXL3.

For example, the first color filter CF1 may be disposed in the first sub pixel area SPXA1, the second color filter CF2 may be disposed in the second sub pixel area SPXA2, and the third color filter CF3 may be disposed in the third sub pixel area SPXA3.

The first color filter CF1 may transmit light of a first color, any may not transmit light of a second color and light of a third color. For example, the first color filter CF1 may include a colorant regarding the first color.

The second color filter CF2 may transmit the light of the second color, and may not transmit the light of the first color and the light of the third color. For example, the second color filter CF2 may include a colorant regarding the second color.

The third color filter CF3 may transmit the light of the third color, and may not transmit the light of the first color and the light of the second color. For example, the third color filter CF3 may include a colorant regarding the third color.

The planarization layer PLA may be disposed on the color filter CF. The planarization layer PLA may cover or overlap the color filter CF. The planarization layer PLA may cancel a step difference generated by the color filter CF.

According to an example, the planarization layer PLA may include an organic insulating material. However, the disclosure is not limited thereto, and the planarization layer PLA may include an inorganic material listed with reference to the first insulating layer INS1.

A structure of the first to third sub pixels SPXL1, SPXL2, and SPXL3 is not limited to the contents described above with reference to FIG. 5, and various structures may be appropriately selected to provide the display device DD according to an embodiment. For example, according to an embodiment, the display device DD may further include a low refractive index layer to improve light efficiency.

Hereinafter, a structure of the display device DD according to an embodiment is described in more detail with reference to FIGS. 6 and 7. For convenience of description, contents that may be repetitive to the above-described contents are simplified or omitted.

Figure 6:
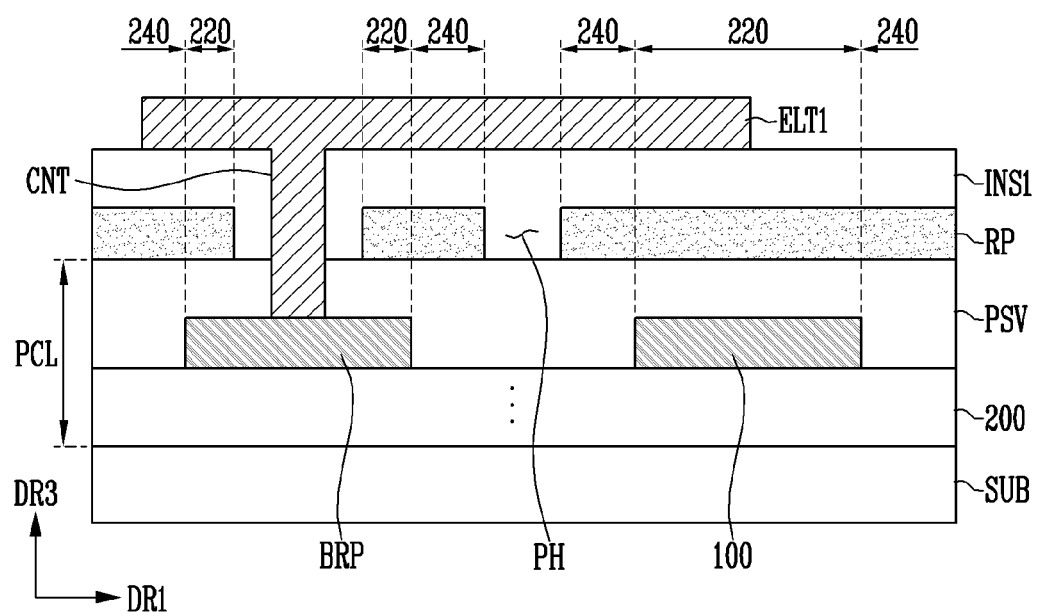
FIG. 6 is a schematic cross-sectional view illustrating a pixel according to an embodiment.

FIG. 6 is a schematic cross-sectional view illustrating a pixel according to an embodiment.

Figure 7:
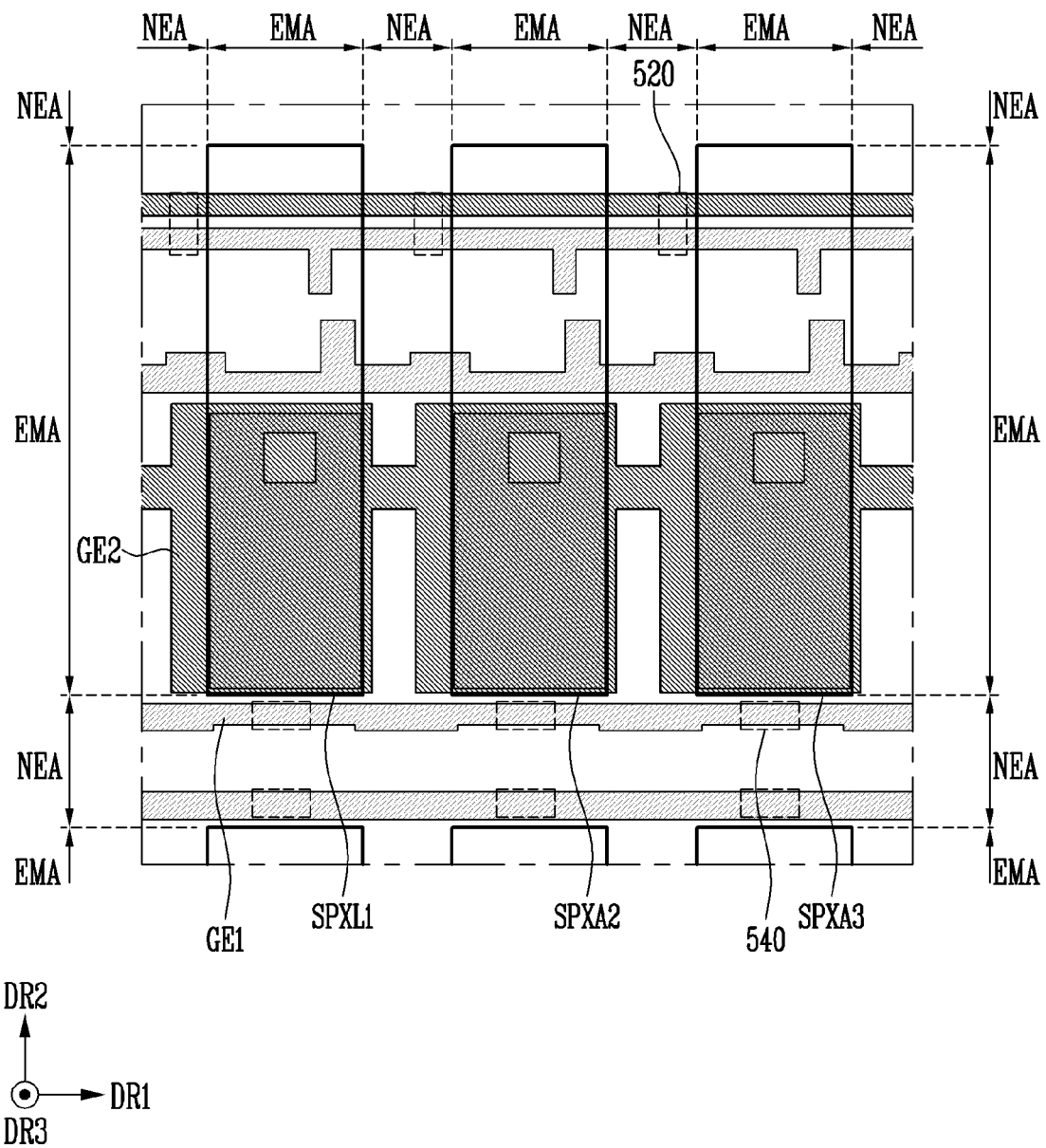
FIG. 7 is a schematic plan view illustrating the pixel according to an embodiment, and is a plan view based on a first gate electrode and a second gate electrode.

FIG. 7 is a schematic plan view illustrating the pixel according to an embodiment, and is a plan view based on the first gate electrode and the second gate electrode.

FIG. 6 is a diagram schematically illustrating layers adjacent to the backplane line 100 and the reflective pattern RP.

In FIG. 6, layers disposed under or below the protective layer PSV among layers included in the pixel circuit part PCL are briefly shown, and the layers disposed under or below the protective layer PSV are included and specified as a lower layer 200. For example, the lower layer 200 may include the buffer layer BFL, the first gate insulating layer GI1, the first interlayer insulating layer ILD1, the second interlayer insulating layer ILD2, and conductive configurations disposed on each layer, disposed on the substrate SUB.

Referring to FIG. 6, the backplane line 100 may be disposed on the lower layer 200.

According to an embodiment, the backplane line 100 may overlap the reflective pattern RP in a plan view. For example, the reflective pattern RP may include a first disposition area 220 and a second disposition area 240. Here, the reflective pattern RP may overlap the backplane line 100 or the bridge pattern BRP in the first disposition area 220, and may be avoided from overlapping (or may not overlap) the backplane line 100 or the bridge pattern BRP in the second disposition area 240.

The reflective pattern RP may be formed on the entire surface of the protective layer PSV, and may not be formed in an area adjacent to an area where the contact portion CNT is disposed. For example, at least a portion of the reflective pattern RP may have a shape surrounding an area where the contact portion CNT is disposed in a plan view.

According to an embodiment, in order to proceed a process of combining the light emitting element LD and the connection electrode COL, in detail, heat is applied in order to form bonding combination between one surface or a surface of the light emitting element LD and the connection electrode COL.

For example, in order to apply the heat, the laser 500 may be provided (or applied) on the connection electrode COL, and the laser 500 may have a wavelength band in a range of about 800 nm to about 1000 nm in order to satisfy a process condition.

At this time, experimentally, the laser 500 provided on the connection electrode COL outputs high energy, and applies the heat to an adjacent area. Therefore, there is a risk that an individual configuration of the pixel circuit part PCL, for example, the backplane line 100 may be damaged.

However, according to an embodiment, the reflective pattern RP may reduce an effect of a laser irradiation process on the pixel circuit part PCL, for example, the backplane line 100. For example, at least a portion of the reflective pattern RP is formed to overlap the backplane line 100 and reflects the irradiated laser 500, and thus the defect to the backplane line 100 due to the irradiated laser 500 may be prevented.

At least a portion of the reflective pattern RP may be spaced apart from each other to form (or define) a through hole PH. According to an example, the first insulating layer INS1 may be filled in an area where the through hole PH is provided.

The through hole PH may mean an opening provided by not disposing the reflective pattern RP. The through hole PH may have a shape surrounding the reflective pattern RP in a plan view. According to an example, the through hole PH may have a circular shape in a plan view. However, the disclosure is not limited thereto, and the through hole PH may be provided in various shapes such as a plate shape.

According to an embodiment, the through hole PH may not overlap the backplane line 100 in a plan view. For example, through holes PH may be provided, and may be disposed so as not to overlap the backplane line 100.

In FIG. 6, the through hole PH overlaps the first electrode ELT1 in a plan view, but is not limited thereto. According to an embodiment, the through hole PH may be selectively disposed also in an area that does not overlap the first electrode ELT1.

The through hole PH may overlap the first gate electrode GE1 and/or the second gate electrode GE2. This is described with reference to FIG. 7. In FIG. 7, the through hole PH is not separately marked in order to clearly show the drawing.

First, the first gate electrode GE1 and the second gate electrode GE2 may be arranged (or disposed) in a shape. For example, a portion of the first gate electrode GE1 and the second gate electrode GE2 may overlap each other in a plan view.

Here, the first gate electrode GE1 may refer to a conductive layer disposed on a same layer as the first gate electrode GE1 described above with reference to FIG. 5. Similarly, the second gate electrode GE2 may refer to a conductive layer disposed on a same layer as the second gate electrode GE2 described above with reference to FIG. 5.

According to an embodiment, the through hole PH may overlap the first gate electrode GE1 in a plan view. For example, the through hole PH may not overlap the backplane line 100, and may overlap the first gate electrode GE1.

According to an embodiment, the through hole PH may overlap the second gate electrode GE2 in a plan view. For example, the through hole PH may not overlap the backplane line 100, and may overlap the second gate electrode GE2.

According to an embodiment, the through hole PH may not overlap the backplane line 100, and may overlap the first gate electrode GE1 and the second gate electrode GE2.

According to an embodiment, through holes PH may be provided and disposed along the first gate electrode GE1 in a plan view. For example, the through holes PH may be arranged or disposed side by side along a path where the first gate electrode GE1 is formed.

According to an embodiment, through holes PH may be provided and disposed along the second gate electrode GE2 in a plan view. For example, the through holes PH may be arranged or disposed side by side along a path where the second gate electrode GE2 is formed.

According to an embodiment, the through hole PH may be disposed in a first through area 520 and/or a second through area 540.

The first through area 520 may be an area where the through hole PH is provided in the reflective pattern RP and may refer to an area overlapping the first gate electrode GE1 or the second gate electrode GE2. According to an example, the first through area 520 may be disposed between pixel areas adjacent to each other in the first direction DR1 (for example, between the first sub pixel area SPXA1 and the second sub pixel area SPXA2, between the second sub pixel area SPXA2 and the third sub pixel area SPXA3, and between the first sub pixel area SPXA1 and the third sub pixel area SPXA3).

Similarly, the second through area 540 may be an area where the through hole PH is provided in the reflective pattern RP and may refer to an area overlapping the first gate electrode GE1 or the second gate electrode GE2. According to an example, the second through area 540 may be disposed between pixel areas adjacent to each other in the second direction DR2.

Experimentally, in case that the protective layer PSV is provided in an embodiment including an organic material, deterioration of the pixel PXL may occur due to outgassing occurring in the protective layer PSV. For example, a shrinkage phenomenon of the pixel PXL or a lifetime reduction of the pixel PXL may occur due to the outgassing occurring in the protective layer PSV.

However, according to an embodiment, the through hole PH may define a path through which the outgassing may be discharged to the outside, thereby reducing an influence of the outgassing on the pixel PXL.

For example, according to an embodiment, the through hole PH may overlap the first gate electrode GE1 and/or the second gate electrode GE2 in a plan view. As described above, according to a process design, the first gate electrode GE1 and the second gate electrode GE2 may include a material (for example, molybdenum (Mo)) resistant to high temperature. In an embodiment, even in a case where the laser is irradiated for the bonding process of the light emitting element LD, the first gate electrode GE1 and/or the second gate electrode GE2 may be less influenced by temperature.

Finally, an embodiment in which the through hole PH is formed to overlap the first gate electrode GE1 and/or the second gate electrode GE2 may also be implemented, and thus a freedom degree in selecting a position of the through hole PH may be increased.

A display device DD according to an embodiment is described with reference to FIGS. 8 and 9. Contents repetitive to the above-described contents are omitted or descriptions thereof are simplified.

Figure 8:
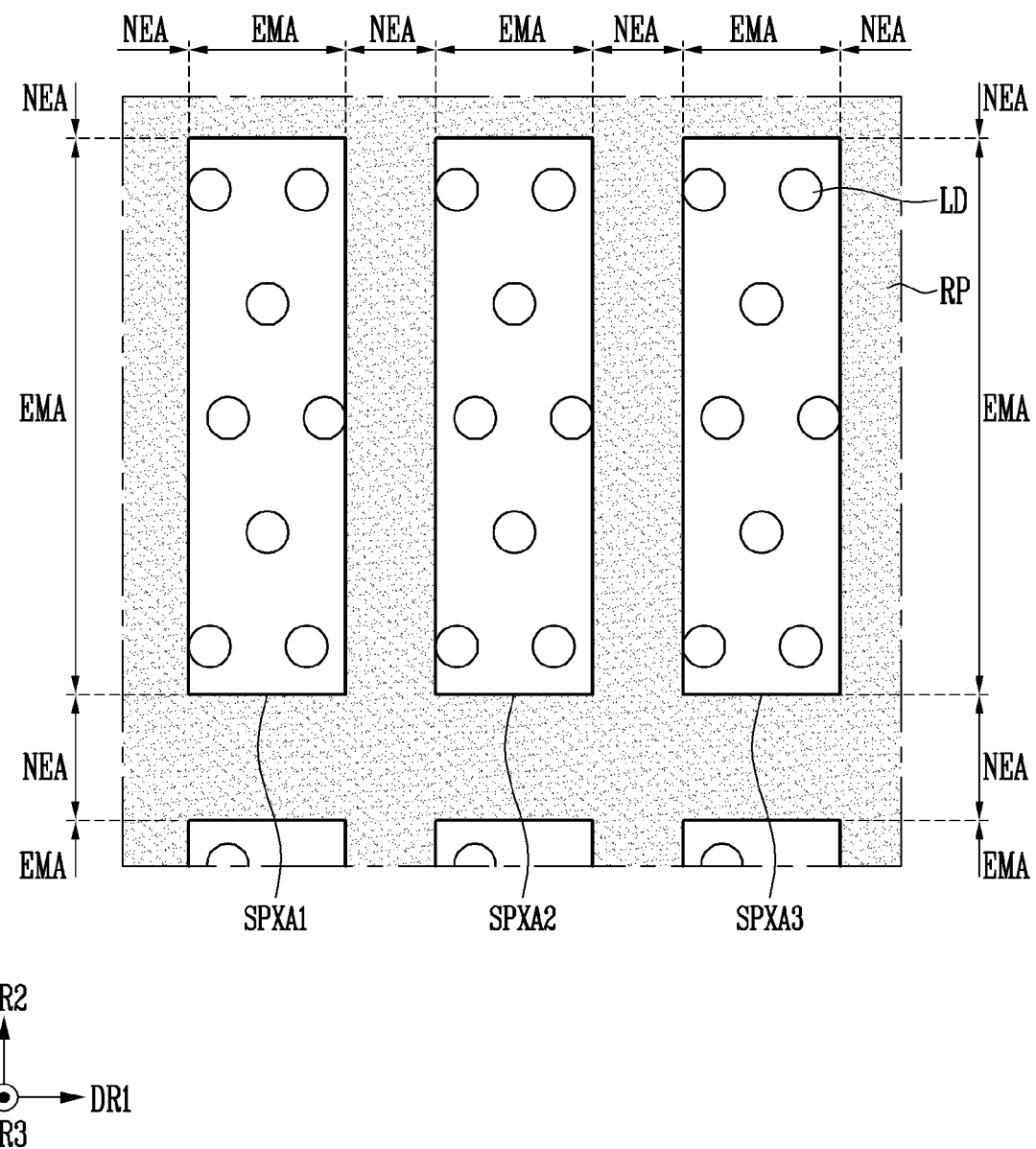
FIG. 8 is a schematic plan view schematically illustrating a pixel according to an embodiment.

FIG. 8 is a schematic plan view schematically illustrating a pixel according to an embodiment.

Figure 9:
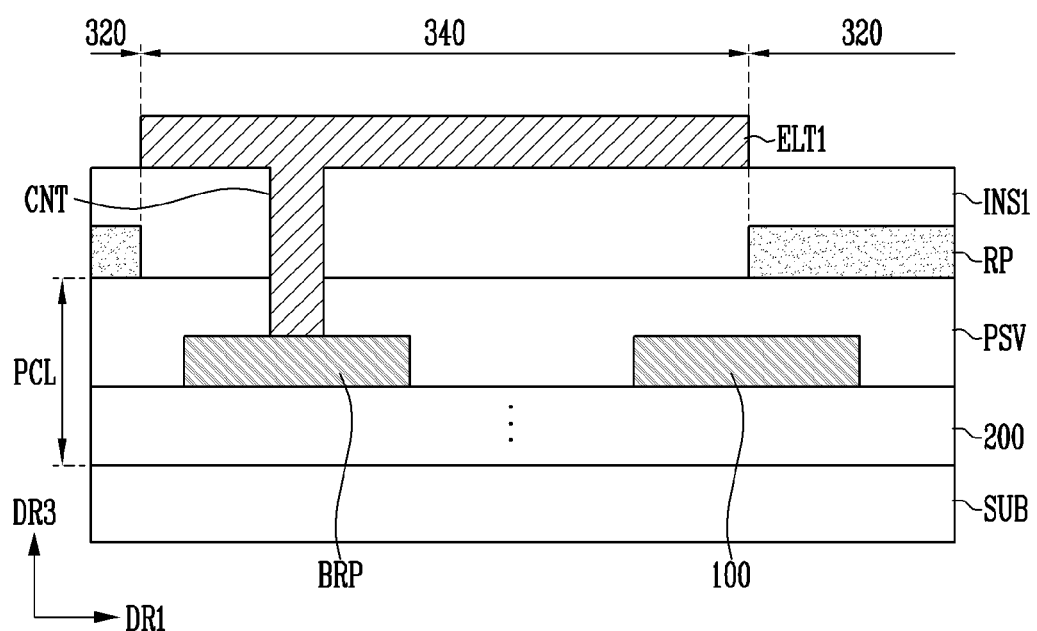
FIG. 9 is a schematic cross-sectional view schematically illustrating the pixel according to an embodiment.

FIG. 9 is a schematic cross-sectional view schematically illustrating the pixel according to an embodiment.

Referring to FIGS. 8 and 9, the pixel PXL according to an embodiment is different from the pixel PXL according to an embodiment in that the reflective pattern RP is not disposed in an area where the light emitting elements LD are disposed. As an embodiment, in the pixel PXL according to an embodiment, the reflective pattern RP may not overlap the first electrode ELT1 in a plan view. (Refer to FIG. 9) For example, the reflective pattern RP may not be disposed in at least a portion of the first to third sub pixel areas SPXA1, SPXA2, and SPXA3. (Refer to FIG. 8)

According to an embodiment, overlapping of the reflective pattern RP with the first electrode ELT1 may be avoided in a plan view.

For example, the display device DD may include a first area 320 and a second area 340. The reflective pattern RP may be disposed in the first area 320. The first electrode ELT1 may be disposed in the second area 340. At this time, the first area 320 and the second area 340 may not overlap each other in a plan view.

According to an embodiment, at least a portion of the backplane line 100 may overlap the first area 320, and at least another portion of the backplane line 100 may overlap the second area 340.

According to an embodiment, the backplane line 100 may overlap another electrode in a plan view. For example, at least a portion of the backplane line 100 may overlap the reflective pattern RP, and at least another portion of the backplane line 100 may overlap the first electrode ELT1. Accordingly, similarly to the display device DD according to an embodiment described above, in case that the laser 500 is irradiated during the arrangement process of the light emitting element LD, the damage to the backplane line 100 due to the irradiated laser 500 may be prevented.

A display device DD according to an embodiment is described with reference to FIG. 10. Contents repetitive to the above-described contents are omitted or descriptions thereof are simplified.

Figure 10:
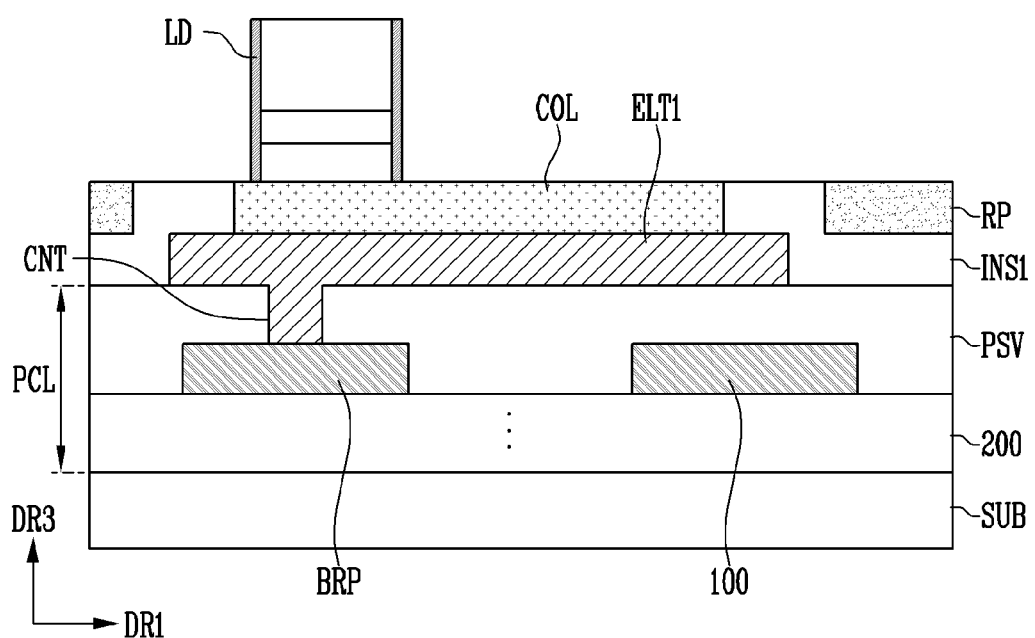
FIG. 10 is a schematic cross-sectional view schematically illustrating a pixel according to an embodiment.

FIG. 10 is a schematic cross-sectional view schematically illustrating a pixel according to an embodiment.

Referring to FIG. 10, the pixel PXL according to an embodiment is different from the pixel PXL according to an embodiment and an embodiment in that a position of the reflective pattern RP is provided similarly to a position of a surface on which the light emitting elements LD are arranged or disposed.

According to an embodiment, the first insulating layer INS1 may be disposed on the protective layer PSV, and the reflective pattern RP may be disposed on the first insulating layer INS1. For example, the first insulating layer INS1 may be formed (or deposited) after the first electrode ELT1 and the connection electrode COL are formed, and the reflective pattern RP may be formed on the first insulating layer INS1.

According to an embodiment, the reflective pattern RP and the connection electrode COL may be formed at a same height. For example, a separation distance between the reflective pattern RP and the substrate SUB may be the same as a separation distance between the connection electrode COL providing the surface on which the light emitting element LD is formed and the substrate SUB. For example, a distance between an upper surface of the reflective pattern RP and the substrate SUB may be the same as a distance between an upper surface of the connection electrode COL and the substrate SUB.

The reflective pattern RP and the connection electrode COL may be disposed at the same height, and may be spaced apart from each other to be electrically separated from each other. Accordingly, a short with respect to the light emitting element LD may be prevented.

According to an embodiment, the light emitting element LD may be prevented from being abnormally arranged or disposed, and an alignment degree of the light emitting element LD may be improved. For example, in case that the reflective pattern RP forms a step difference with respect to the surface on which the light emitting element LD is provided, the light emitting element LD may be inclined. (For example, an outer area of the connection electrode COL) A normal operation of the inclined light emitting element LD may be difficult. However, the step difference between the upper surface of the reflective pattern RP and the surface on which the light emitting element LD is provided (for example, the upper surface of the connection electrode COL) may be reduced, and thus a phenomenon in which the light emitting element LD is inclined may be prevented.

According to an embodiment, an oxide layer may be formed (or provided) on an outer surface of the reflective pattern RP. For example, the reflective pattern RP may include the oxide layer formed on the outer surface thereof. The oxide layer formed on the outer surface may prevent the reflective pattern RP from being electrically shorted with another line. For example, the oxide layer formed on the outer surface may prevent the reflective pattern RP from being electrically shorted with the connection electrode COL or the first electrode ELT1.

According to an embodiment, a separate insulating layer may be additionally disposed on the reflective pattern RP. The additionally formed insulating layer may prevent the connection electrode COL and the first electrode ELT1 from being electrically shorted with the reflective pattern RP.

Hereinafter, a method of manufacturing a display device according to an embodiment is described with reference to FIGS. 11 to 14. Descriptions of contents that may be repetitive to the above-described contents are simplified or omitted for convenience of description.

FIGS. 11 to 14 are schematic cross-sectional views for each process step illustrating a method of manufacturing a display device according to an embodiment. FIGS. 11 to 14 are schematic cross-sectional views illustrating the structure of the display device DD shown in FIG. 5.

Figure 11:
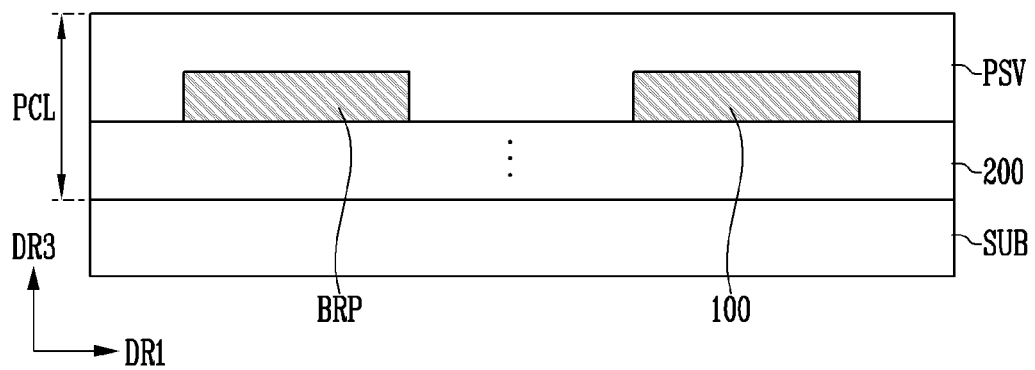
FIGS. 11 to 14 are schematic cross-sectional views for each process step illustrating a method of manufacturing a display device according to an embodiment.

Referring to FIG. 11, the substrate SUB may be provided (or prepared), and the pixel circuit part PCL may be disposed on the substrate SUB. Individual configurations of the pixel circuit part PCL disposed on the substrate SUB may be formed by patterning a conductive layer (or a metal layer), an inorganic material, an organic material, or the like by performing a process using a mask.

The lower layer 200 may be disposed on the substrate SUB, and the bridge pattern BRP and the backplane line 100 may be formed on the lower layer 200. Here, the bridge pattern BRP and the backplane line 100 may be formed in the same process.

The backplane line 100 may be patterned after forming a conductive layer including a conductive material.

The protective layer PSV may be disposed (or formed) to at least cover or overlap the backplane line 100.

Figure 12:
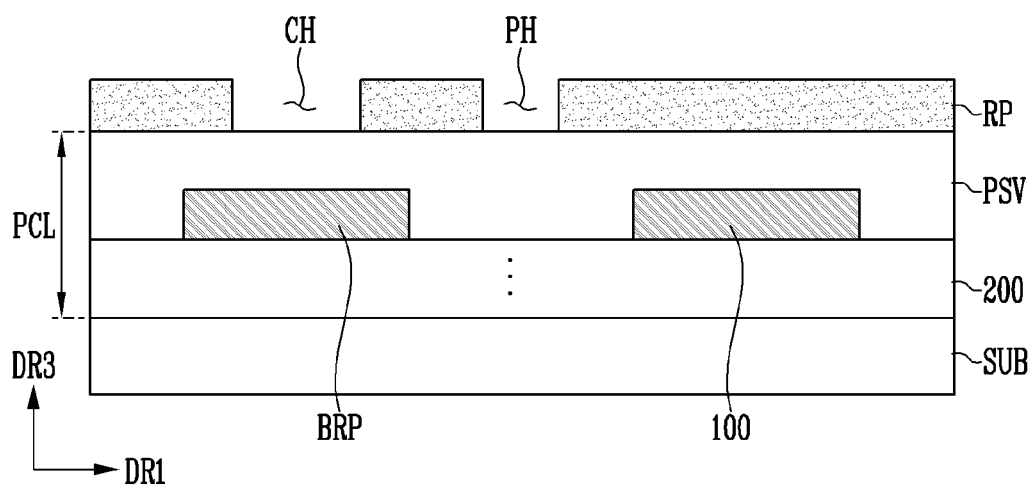

Referring to FIG. 12, the reflective pattern RP may be disposed on the protective layer PSV. The reflective pattern RP may be patterned after depositing (or forming) a base conductive layer for forming the reflective pattern RP on the protective layer PSV.

At least a portion of the reflective pattern RP may be formed to overlap the backplane line 100 in a plan view.

As a subsequent process is performed, the contact hole CH may be formed including a position where the contact portion CNT is to be formed. According to an embodiment, the position of the formed contact hole CH may overlap the bridge pattern BRP in a plan view.

The through hole PH may be formed by preventing the reflective pattern RP from being disposed at least a portion. According to an embodiment, a position of the formed through hole PH may not overlap the backplane line 100 in a plan view. Accordingly, in case that the protective layer PSV may include an organic material, outgassing that may be generated may be discharged to the outside through the through hole PH.

According to an embodiment, the through hole PH may be provided to overlap the first gate electrode GE1 and/or the second gate electrode GE2 disposed in the lower layer 200.

According to an embodiment, the reflective pattern RP may be provided so as not to overlap an area where the first electrode ELT1 to be provided later is to be disposed.

According to an embodiment, the reflective pattern RP may be provided after the first electrode ELT1 and the connection electrode COL, which are provided later other than the other step, are formed. The reflective pattern RP may be provided at substantially the same height as the surface on which the light emitting element LD is provided (refer to FIG. 10), and thus the alignment degree of the light emitting element LD may be improved.

Figure 13:
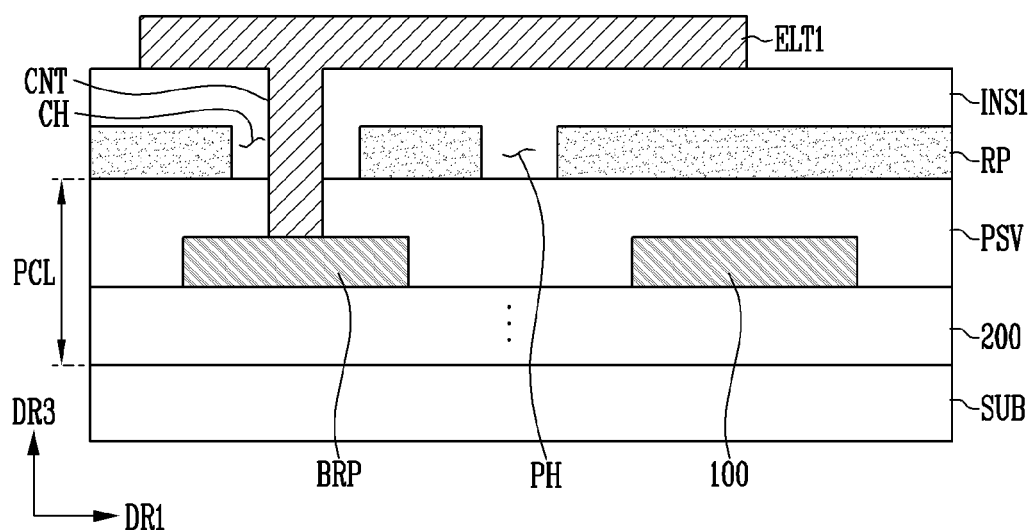

Referring to FIG. 13, the first insulating layer INS1 may be deposited (disposed, or formed), and the first electrode ELT1 may be disposed on the first insulating layer INS1.

The first insulating layer INS1 may be formed to at least cover or overlap the reflective pattern RP, and at least a portion of the first insulating layer INS1 may be provided in the through hole PH.

The contact hole CH passing through the first insulating layer INS1 and the protective layer PSV may be formed, and the first electrode ELT1 may be provided. The first electrode ELT1 may be patterned on the first insulating layer INS1, and the first electrode ELT1 may be electrically connected to the bridge pattern BRP through the contact portion CNT formed in the contact hole CH passing through the first insulating layer INS1 and the protective layer PSV.

Figure 14:
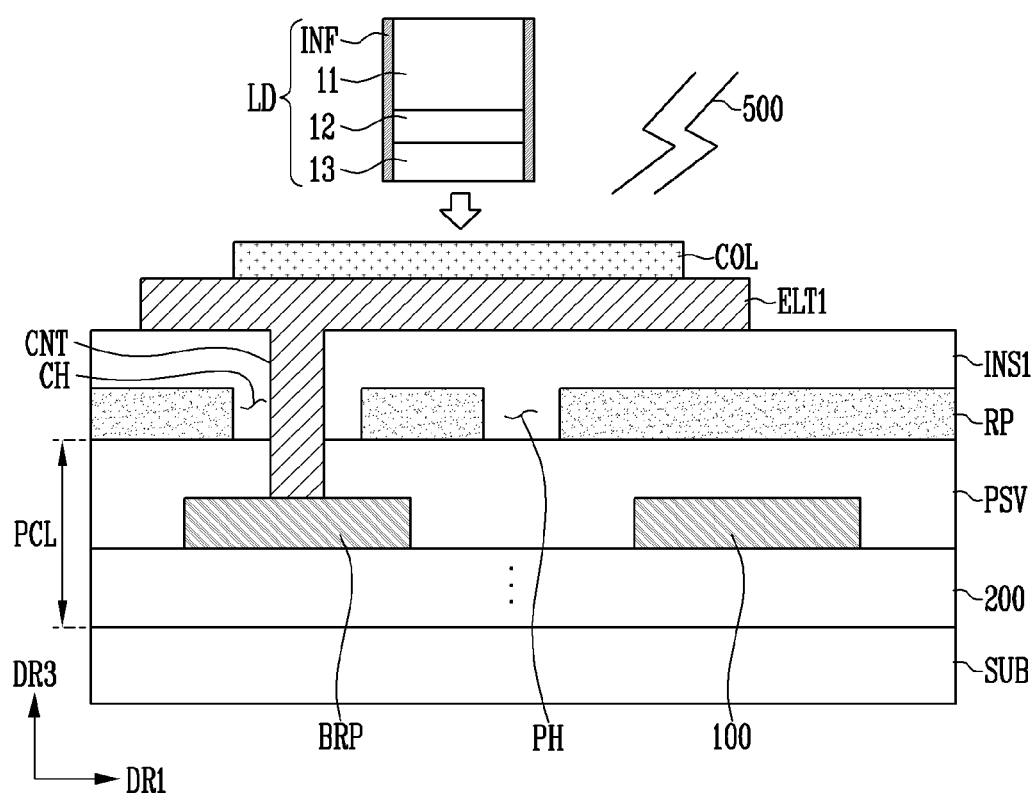

Referring to FIG. 14, the connection electrode COL may be disposed on the first electrode ELT1, and the light emitting element LD may be disposed on the connection electrode COL. The connection electrode COL may include a bonding metal.

At least a portion of the connection electrode COL may be formed to be connected to the first electrode ELT1. For example, the connection electrode COL may be provided by forming an electrode layer to cover or overlap the first electrode ELT1 and patterning the electrode layer.

The second semiconductor layer 13 of the light emitting element LD may be disposed to face the connection electrode COL. Although not shown separately in the drawing, the light emitting element LD may be attached to a separately provided donor film and transferred onto the connection electrode COL.

Here, the donor film may be provided in advance at a specific or given position before the light emitting element LD is disposed on the substrate SUB and the pixel circuit part PCL. According to an example, the donor film may be referred to as a donor wafer or a donor substrate. However, the disclosure is not limited thereto, and the donor film may be referred to as a carrier substrate.

The light emitting element LD may be disposed on the pixel circuit part PCL. According to an embodiment, the light emitting element LD may be transferred using a transfer method using separate heat source, an electrostatic transfer method, an elastomer stamp transfer method, or the like within the spirit and the scope of the disclosure.

According to an embodiment, the transfer method using separate heat source, for example, a transfer method based on the laser 500 may be applied to the light emitting element LD. Hereinafter, the description is given based on an embodiment in which the laser 500 is used as a heat source for combining the light emitting element LD and the connection electrode COL.

The light emitting element LD may be arranged or disposed on the connection electrode COL, and the separate laser 500 may be provided (or irradiated) between the light emitting element LD and the connection electrode COL. As described above, the laser 500 may have the wavelength band in a range of about 800 nm to about 1000 nm.

At this time, the laser 500 may be irradiated, and thus combination may be formed between the light emitting element LD and the connection electrode COL by heat. Accordingly, the light emitting element LD and the connection electrode COL may be combined with each other. According to an example, a eutectic bonding method may be applied.

Light emitting elements LD may be transferred onto the connection electrode COL and may be separated from each other.

As the laser 500 is irradiated, heat may be applied to an area adjacent to the connection electrode COL and/or the light emitting element LD. However, according to an embodiment, the reflective pattern RP including a reflective material may be disposed in an area overlapping the backplane line 100, and thus damage due to the laser 500 may be prevented.

Thereafter, although not shown in the drawing, the light emitting element LD and the second electrode ELT2 may be connected, the display element part DPL may be provided by forming the second insulating layer INS2, and the light control portion LCP may be disposed on the display element part, to provide the display device DD according to an embodiment.

Hereinafter, an application field of the display device DD according to an embodiment is described with reference to FIGS. 15 to 18. FIGS. 15 to 18 are diagrams illustrating examples to which a display device according to an embodiment is applied. According to an example, the display device DD may be applied to a smart phone, a notebook computer, a tablet PC, a television, and the like, and may be applied to various other embodiments.

Figure 15:
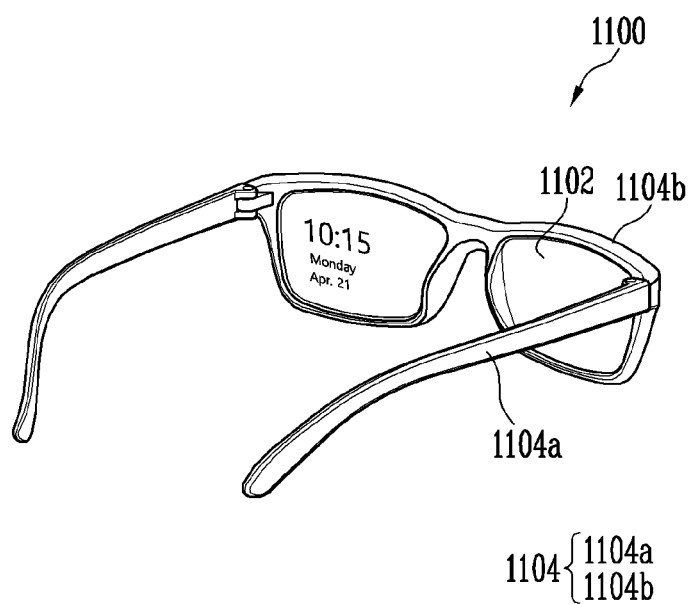
FIGS. 15 to 18 are diagrams illustrating examples to which a display device according to an embodiment is applied.

Referring to FIG. 15, a display device DD according to an embodiment may be applied to a smart glass 1100 including a frame 1104 and a lens portion 1102. The smart glass 1100 may be a wearable electronic device that may be worn on a face of a user, and may be a structure in which a portion of the frame 1104 is folded or unfolded. For example, the smart glass 1100 may be a wearable device for augmented reality (AR).

The frame 1104 may include a housing 1104b supporting the lens portion 1102 and a leg portion 1104a for wearing of the user. The leg portion 1104a may be connected to the housing 1104b by a hinge and may be folded or unfolded.

The frame 1104 may include a battery, a touch pad, a microphone, a camera, and the like therein. The frame 1104 may include a projector that outputs light, a processor that controls a light signal or the like, and the like therein.

The lens portion 1102 may be an optical member that transmits light or reflects light. The lens portion 1102 may include glass, transparent synthetic resin, or the like within the spirit and the scope of the disclosure.

The lens portion 1102 may reflect an image by a light signal transmitted from the projector of the frame 1104 by a rear surface (for example, a surface of a direction facing an eye of the user) of the lens portion 1102 to allow the eye of the user to recognize. For example, as shown in the drawing, the user may recognize information such as time and date displayed on the lens portion 1102. For example, the lens portion 1102 may be one type of a display device, and the display device DD according to the above-described embodiment may be applied to the lens portion 1102.

Figure 16:
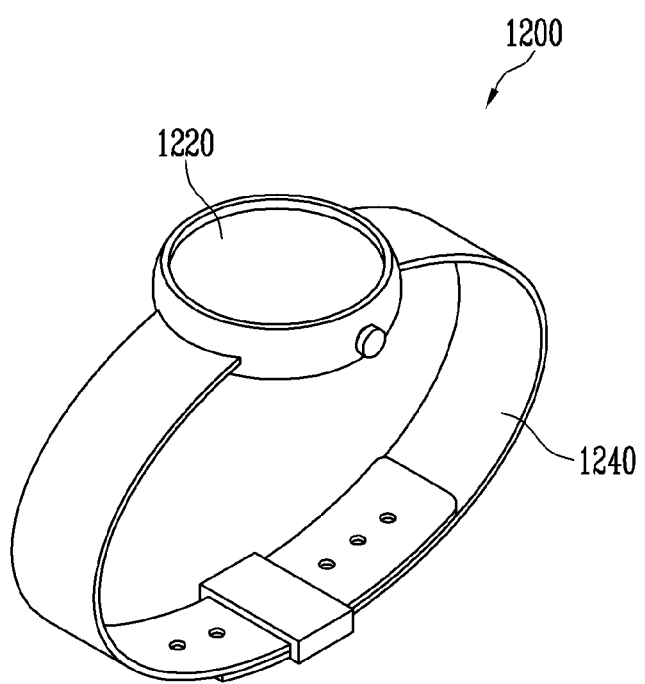

Referring to FIG. 16, a display device DD according to an embodiment may be applied to a smart watch 1200 including a display portion 1220 and a strap portion 1240.

The smart watch 1200 may be a wearable electronic device and may have a structure in which the strap portion 1240 is mounted on a wrist of a user. Here, the display device DD according to an embodiment may be applied to the display portion 1220, and thus image data including time information may be provided to the user.

Figure 17:
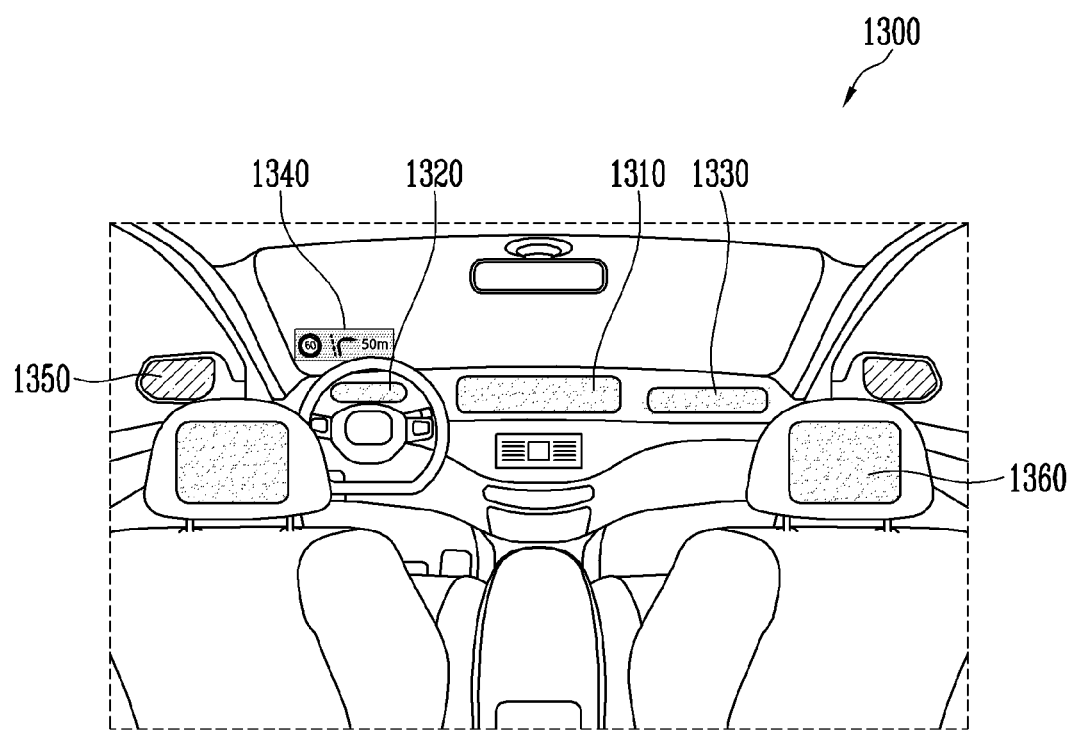

Referring to FIG. 17, a display device DD according to an embodiment may be applied to an automotive display 1300. Here, the automotive display 1300 may mean an electronic device provided inside and outside a vehicle to provide image data.

According to an example, the display device DD may be applied to at least one of an infotainment panel 1310, a cluster 1320, a co-driver display 1330, a head-up display 1340, a side mirror display 1350, and a rear seat display 1360, which are provided in the vehicle.

Figure 18:
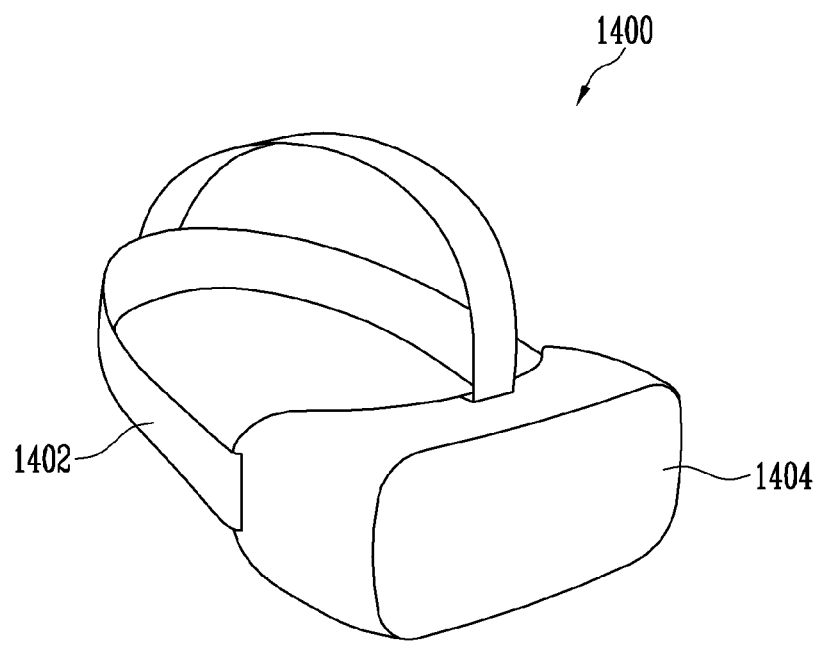

Referring to FIG. 18, a display device DD according to an embodiment may be applied to a head mounted display (HMD) 1400 including a head mounting band 1402 and a display storage case 1404. The HMD 1400 is a wearable electronic device that may be worn on a head of a user.

The head mounting band 1402 is a portion connected to the display storage case 1404 and fixing the display storage case 1404. In the drawing, the head mounting band 1402 is shown to be able to surround an upper surface and both side surfaces of the head of the user, but the disclosure is not limited thereto. The head mounting band 1402 may be for fixing the HMD 1400 to the head of the user, and may be formed in an eyeglass frame form or a helmet form.

The display storage case 1404 may accommodate the display device DD and may include at least one lens. The at least one lens is a portion that provides an image to the user. For example, the display device DD according to an embodiment may be applied to a left-eye lens and a right-eye lens implemented in the display storage case 1404.

The application field of the display device DD according to an embodiment is not limited to the above-described example, and may be applied to various fields according to an embodiment.

The above description is merely an example of the spirit and scope of the disclosure, and those skilled in the art to which the disclosure pertains will be able to make various modifications and variations without departing from the characteristics and the spirit and scope of the disclosure. Therefore, embodiments described above may be implemented separately or in combination with each other.

Therefore, embodiments disclosed in the disclosure are not intended to limit the spirit and scope of the disclosure, but to describe the spirit and scope of the disclosure, and the spirit and scope of the disclosure is not limited by these embodiments. The scope of the disclosure should be interpreted by the following claims, and it should be interpreted that all equivalents are included in the spirit and scope of the disclosure.

What is claimed is:

1. A display device comprising:
   a backplane line disposed on a substrate;
   a protective layer overlapping the backplane line;
   a first electrode disposed on the protective layer;
   a light emitting element electrically connected to the first electrode; and
   a reflective pattern including a reflective material and disposed between the substrate and the first electrode, wherein
   the reflective pattern overlaps the backplane line in a plan view,
   the reflective pattern includes a first disposition area and a second disposition area, and
   the reflective pattern overlaps the backplane line in the first disposition area and does not overlap the backplane line in the second disposition area.

2. The display device according to claim 1, wherein the reflective pattern includes at least one of aluminum (Al), molybdenum (Mo), copper (Cu), silver (Ag), magnesium (Mg), platinum (Pt), palladium (Pd), gold (Au), nickel (Ni), neodymium (Nd), iridium (Ir), chromium (Cr), titanium (Ti), and an alloy thereof, and the light emitting element is overlapped with the reflective pattern and the backplane line in the plan view.

3. The display device according to claim 1, wherein the reflective pattern has a thickness of about 300 Å or more.

4. The display device according to claim 1, wherein the reflective pattern is disposed on the protective layer.

5. The display device according to claim 1, further comprising:
a bridge pattern disposed between the substrate and the first electrode and electrically connected to the first electrode through a contact portion,
wherein at least a portion of the reflective pattern has a shape surrounding an area including the contact portion in the plan view.

6. The display device according to claim 1, further comprising:
a first area in which the reflective pattern is disposed; and
a second area in which the first electrode is disposed, wherein
the first area and the second area do not overlap each other in the a plan view,
at least a portion of the backplane line overlaps the first area in the a plan view, and
at least another portion of the backplane line overlaps the second area in the a plan view.

7. The display device according to claim 1, wherein the backplane line provides an electrical signal to the light emitting element.

8. The display device according to claim 1, wherein
the first electrode is electrically connected to an end of the light emitting element,
the display device further comprises: a second electrode electrically connected to another end of the light emitting element and providing a cathode signal to the light emitting element, and
the reflective pattern is electrically connected to the second electrode.

9. The display device according to claim 1, further comprising:
a first sub pixel area that emits light of a first color;
a second sub pixel area that emits light of a second color; and
a third sub pixel area that emits light of a third color.

10. The display device according to claim 9, further comprising:
a first wavelength conversion pattern disposed in the first sub pixel area;
a second wavelength conversion pattern disposed in the second sub pixel area; and
a light transmission pattern disposed in the third sub pixel area, wherein
at least a portion of the light emitting element overlaps the first sub pixel area,
another portion of the light emitting element overlaps the second sub pixel area,
another portion of the light emitting element overlaps the third sub pixel area, and
the light emitting element emits light of the third color.

11. A display device comprising:
a backplane line disposed on a substrate;
a protective layer overlapping the backplane line;
a first electrode disposed on the protective layer;
a light emitting element electrically connected to the first electrode;
a reflective pattern including a reflective material and disposed between the substrate and the first electrode; and
a through hole by which at least a portion of the reflective pattern is spaced apart from another portion of the reflective pattern,
wherein the reflective pattern overlaps the backplane line in a plan view.

12. The display device according to claim 11, wherein
the protective layer includes an organic material, and
the through hole does not overlap the backplane line in the plan view.

13. The display device according to claim 11, further comprising:
a first gate electrode disposed between the substrate and the protective layer, and including at least a portion overlapping the through hole in the & plan view.

14. The display device according to claim 13, wherein the first gate electrode includes molybdenum (Mo).

15. The display device according to claim 13, further comprising:
a gate insulating layer disposed on the first gate electrode; and
a second gate electrode disposed on the gate insulating layer,
wherein the through hole overlaps the first gate electrode and the second gate electrode in the plan view.

16. The display device according to claim 13, wherein through holes are disposed along the first gate electrode in the plan view.

17. The display device according to claim 13, further comprising:
sub pixel areas that emit light of different colors, respectively, wherein
each of the through holes is disposed in a first through area and a second through area overlapping at least a portion of the first gate electrode, in the & plan view,
the first through area is disposed between adjacent sub pixel areas in a first direction, and
the second through area is disposed between adjacent sub pixel areas in a second direction intersecting the first direction.

* * * * *